US010243394B2

(12) United States Patent
Steinbuchel, IV et al.

(10) Patent No.: US 10,243,394 B2
(45) Date of Patent: Mar. 26, 2019

(54) PORTABLE ELECTRIC VEHICLE SUPPLY EQUIPMENT

(71) Applicant: AEROVIRONMENT, INC., Monrovia, CA (US)

(72) Inventors: Herman Joseph Steinbuchel, IV, Pasadena, CA (US); Albert Joseph Flack, Lake Arrowhead, CA (US); Richard Elliott Zanteson, Altadena, CA (US)

(73) Assignee: WEBASTO CHARGING SYSTEMS, INC., Simi Valley, CA (US)

( * ) Notice: Subject to any disclaimer, the term of this patent is extended or adjusted under 35 U.S.C. 154(b) by 629 days.

(21) Appl. No.: 14/631,120

(22) Filed: Feb. 25, 2015

(65) Prior Publication Data

US 2015/0303737 A1 Oct. 22, 2015

Related U.S. Application Data

(63) Continuation of application No. PCT/US2013/056871, filed on Aug. 27, 2013.
(Continued)

(51) Int. Cl.
*H02J 7/00* (2006.01)
*H02J 7/02* (2016.01)
(Continued)

(52) U.S. Cl.
CPC ............ *H02J 7/027* (2013.01); *B60L 3/0069* (2013.01); *B60L 3/04* (2013.01); *B60L 11/1803* (2013.01);
(Continued)

(58) Field of Classification Search
CPC ...................................................... H02J 7/027
(Continued)

(56) References Cited

U.S. PATENT DOCUMENTS 7,253,584 B2   8/2007   Souther et al.
8,198,855 B2   6/2012   Fukui et al.
(Continued)

FOREIGN PATENT DOCUMENTS

CN   101811446 A   8/2010
CN   102484341 A   5/2012
(Continued)

OTHER PUBLICATIONS

China First Office Action for CN Application No. 2013800442706 dated Oct. 18, 2016.
(Continued)

*Primary Examiner* — Richard V Muralidar
(74) *Attorney, Agent, or Firm* — Brooks Acordia IP Law, PC; Michael Zarrabian

(57) ABSTRACT

An electric vehicle service equipment (EVSE) system includes an EVSE case having a front plug face, a rear face, and left and right gripping sides that collectively define a trapezoidal prism cross section, the left and right gripping sides further having left and right convex gripping portions, respectively, a relay positioned within the EVSE case, and a controller positioned within the EVSE case and in communication with the relay, the controller responsive to a pilot duty signal, when a pilot duty signal is present.

28 Claims, 15 Drawing Sheets

Related U.S. Application Data

(60) Provisional application No. 61/693,733, filed on Aug. 27, 2012.

(51) Int. Cl.
  B60L 3/00 (2019.01)
  B60L 3/04 (2006.01)
  B60L 11/18 (2006.01)
  G01R 31/36 (2019.01)
  H01R 13/447 (2006.01)
  H01R 13/703 (2006.01)
  H01R 29/00 (2006.01)

(52) U.S. Cl.
  CPC ....... B60L 11/1818 (2013.01); B60L 11/1846 (2013.01); B60L 11/1872 (2013.01); G01R 31/3662 (2013.01); G01R 31/3682 (2013.01); H02J 7/0042 (2013.01); B60L 2230/12 (2013.01); B60L 2240/80 (2013.01); B60L 2250/10 (2013.01); H01R 13/447 (2013.01); H01R 13/7038 (2013.01); H01R 29/00 (2013.01); Y02T 10/7005 (2013.01); Y02T 10/7088 (2013.01); Y02T 90/121 (2013.01); Y02T 90/128 (2013.01); Y02T 90/14 (2013.01); Y02T 90/16 (2013.01); Y02T 90/163 (2013.01); Y02T 90/169 (2013.01); Y04S 30/14 (2013.01)

(58) Field of Classification Search
  USPC .................................................. 320/107, 109
  See application file for complete search history.

(56) References Cited

U.S. PATENT DOCUMENTS

| | | | |
|---|---|---|---|
| 9,308,825 B2* | 4/2016 | Hayashigawa | B60L 11/1862 |
| 9,597,967 B2* | 3/2017 | DeBoer | B60L 11/1824 |
| 9,882,313 B2* | 1/2018 | Steinbuchel, IV | H01R 31/06 |
| 2004/0252529 A1 | 12/2004 | Huber et al. | |
| 2007/0252529 A1 | 11/2007 | Belinger | |
| 2010/0174667 A1* | 7/2010 | Vitale | B60L 3/0069 705/412 |
| 2010/0306033 A1 | 12/2010 | Oved et al. | |
| 2011/0011710 A1 | 1/2011 | Dodal et al. | |
| 2011/0051463 A1* | 3/2011 | Chen | H02M 3/33507 363/19 |
| 2011/0169447 A1 | 7/2011 | Brown et al. | |
| 2012/0119702 A1 | 5/2012 | Gaul et al. | |
| 2012/0134076 A1 | 5/2012 | Gausepohl et al. | |
| 2012/0206100 A1* | 8/2012 | Brown | B60L 3/0069 320/109 |
| 2012/0212179 A1 | 8/2012 | Nathan et al. | |
| 2012/0249066 A1 | 10/2012 | Ichikawa | |

FOREIGN PATENT DOCUMENTS

| | | |
|---|---|---|
| CN | 102544844 A | 7/2012 |
| JP | 03222635 | 10/1991 |
| JP | 1994038174 | 5/1994 |
| JP | 2004343996 A | 12/2004 |
| JP | 2010110055 A | 5/2010 |
| JP | 2011024341 A | 2/2011 |
| WO | 2011064856 A1 | 6/2011 |
| WO | 2012058421 A2 | 5/2012 |
| WO | 2012099978 A2 | 7/2012 |

OTHER PUBLICATIONS

Examination Report for Serial No. 2013308938 dated Apr. 11, 2017.
International Search Report and Written Opinion for PCT/US2013/056871 dated Apr. 9, 2014.
EP Supplementary Partial Search Report for EP application No. EP13833303 completed Aug. 30, 2016.

* cited by examiner

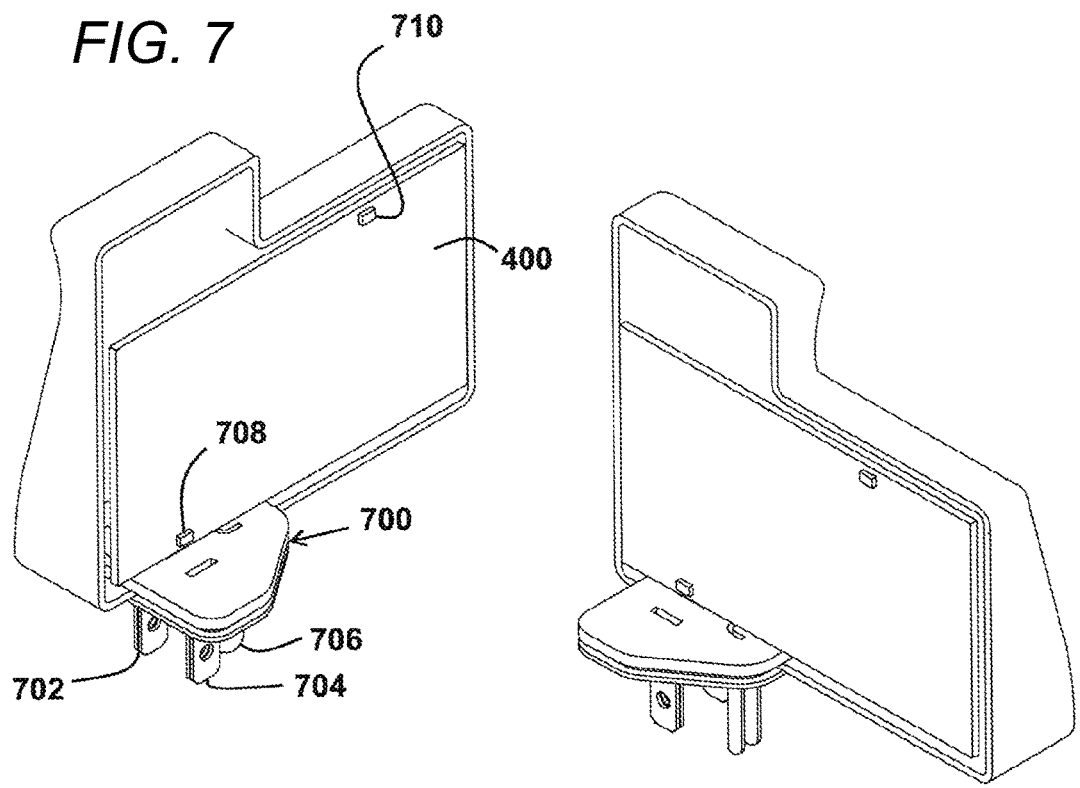
FIG. 7
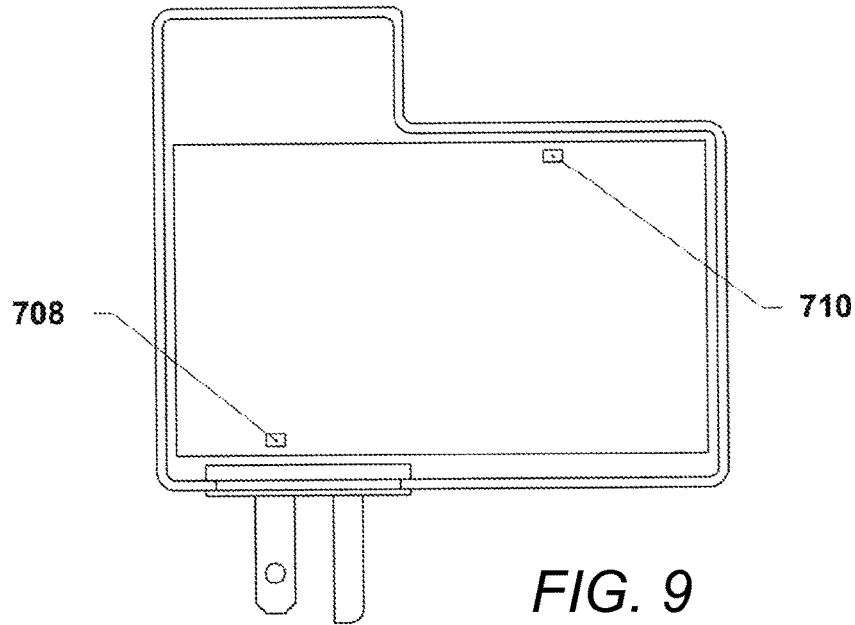
FIG. 8
FIG. 9

PORTABLE ELECTRIC VEHICLE SUPPLY EQUIPMENT

CROSS-REFERENCE TO RELATED APPLICATIONS

This application is a continuation of International Application No. PCT/US2013/056871 filed Aug. 27, 2013, which claims priority to and the benefit of U.S. Provisional Patent Application No. 61/693,733 filed Aug. 27, 2012, the contents of which are hereby incorporated by reference herein in their entirety for all purposes.

BACKGROUND

Field of the Invention

The field of the invention is electric vehicle (EV) charging, and more particularly electric vehicle supply equipment (EVSE) that use AC utility power to charge the EVs.

Description of the Related Art

Electric vehicle supply equipment (EVSE) may be used to charge electric vehicles (EV) and may utilize standard AC utility power taken from a standard utility socket in the home or at other locations to draw power. One example of a prior art EVSE is illustrated in FIG. 1a, with an EVSE case 1 enclosing a power supply, controller and relays (not shown) to accept utility power provided from a receptacle plug assembly 2 and power cord 3 for selective communication of the power to a J1772 compliant connector 4.

SUMMARY

An electric vehicle service equipment (EVSE) system includes an EVSE case having a front plug face, a rear face, and left and right gripping sides that collectively define a trapezoidal prism cross section, the left and right gripping sides further having left and right convex gripping portions, respectively; a relay positioned within the EVSE case; and a controller positioned within the EVSE case and in communication with the relay, the controller responsive to a pilot duty signal, when a pilot duty signal is present. In some embodiments, a portion of the rear face has a base cutout to form a conning tower which may have a cable connected to the conning tower at an orientation that is perpendicular to the front plug face so that the cable extends initially parallel to the front plug face. In other embodiments, the distance from the front plug face to the rear face may be less than or equal to 3.1 inches. Additionally the system may have power and neutral plug blades extending from the front plug face; and a thermistor in thermal communication with the power and neutral plug blades. In other embodiments the system may have a transformer, which may be a flyback-based transformer. Additionally the system may have an outdoor plug enclosure encompassing the EVSE case. In one embodiment, at least one of the left and right gripping sides are at an angle (Anglex) of less than or equal to 72 degrees with the front plug face.

An electric vehicle service equipment (EVSE) system includes an interior tapered electronics volume extending away from a front plug face, the interior tapered electronics volume encompassing a relay and a relay controller positioned in an EVSE case, the relay controller responsive to a pilot duty signal, when a pilot duty signal is present; and an expanding volume complementary to the interior tapered electronics volume, the expanding volume defined between an interior of an outdoor protective cover and an exterior of the interior tapered electronics volume. In some embodiments, the interior tapered electronics volume is an interior of an EVSE case.

A method of operating an electric vehicle supply equipment (EVSE) is disclosed that comprises plugging an EVSE connector into an AC power outlet, pressing and holding a plug release button on a SAE-J1772-compliant connector coupled to the EVSE connector for greater than three seconds, releasing the plug release button, signaling a user that the SAE-J1772-compliant connector has entered a program mode, and pressing the plug release button at least one time to select an electric vehicle (EV) current draw profile selected from the group consisting of 1) a AC power frequency-dependent EV current draw, 2) a time-of-day dependent current draw, and 3) a reduced current draw. The method may include monitoring a plug release button signal in a controller to determine if the plug release button is being pressed, and exiting the program mode in response to at least three seconds of plug release button inactivity.

A method of determining faults in an electric vehicle supply equipment (EVSE) is disclosed that comprises applying a differential direct current (DC) bias voltage to first and second output lines of a SAE-J1772-compliant connector, and measuring respective voltages of the first and second output lines to determine if a fault exists in the SAE-J1772-compliant connector. The method may include indicating to a user a connector fault in response to either the voltage of the first output or the voltage of the second output failing to attain its respective DC bias voltage, so that the failure of either the voltage of the first output or the voltage of the second output failing to attain its respective DC bias voltage indicates an output line fault or welded relay fault. The method may also include connecting the SAE-J1772-compliant connector to an electric vehicle (EV) charge connector, and may include indicating to a user a connector fault in response to said measuring indicating a differential voltage of zero volts so that the differential voltage of zero volts indicates a low impedance condition through the EV charge connector. In such embodiments, the method may include indicating to a user a connector fault in response to said measuring indicating only one of said first output and said second output at zero volts so that the measured voltage of zero volts at the only one output indicates the measured zero volts output line is shorted to ground. The method may also include closing first and second relays in electrical communication with said first and second outputs, respectively, measuring respective voltages of first and second input lines that are in electrical communication with said first and second output lines, respectively, through first and second relays, respectively, and indicating to a user a connector fault in response to said measuring indicating said measured voltages of first and second input lines equal said measured voltages of said first and second output lines, respectively so that the equal measured voltages indicate a relay fault.

A method of avoiding excessive electrical-induced heat is disclosed that comprises measuring a plug blade temperature at a blade location between a power plug blade and neutral plug blade of an electric vehicle supply equipment (EVSE), measuring a reference temperature at a location removed from the blade location, and calculating a temperature differential between the plug blade temperature and reference temperature. The method may include stopping electric vehicle (EV) charging in response to the temperature differential being greater than a predetermined temperature differential limit, and may include reducing electric vehicle (EV) charging in response to the temperature differential being greater than a predetermined temperature differential limit.

A method of avoiding excessive electrical-induced heat is disclosed that comprises measuring a plug blade temperature at a blade location between a power plug blade and neutral plug blade of an electric vehicle supply equipment (EVSE), comparing the plug blade temperature to a predetermined plug blade cut-off temperature, and stopping electric vehicle (EV) charging in response to the plug blade temperature being greater than the predetermined plug blade cut-off temperature.

An configurable AC plug apparatus is disclosed that comprises a rotatable first plug blade on a plug body, a rotatable second plug blade on said plug body, said rotatable second plug blade coupled to a switch armature, and an indicator switch on said plug body, said switch armature coupled to close said indicator switch as said rotatable second plug switch rotates. The apparatus may also comprise a controller in communication with the indicator switch, said controller configured to receive a voltage signal indicating a voltage of said first plug blade and a voltage of said second plug blade. The rotatable first plug, rotatable second plug, indicator switch and controller may also be configured to identify use of the first and second plugs with at least one National Electrical Manufacturers Association (NEMA) standardized AC power receptacle selected from the group consisting of NEMA 5-15, 5-20, 6-15 and 6-20 receptacles.

BRIEF DESCRIPTION OF THE DRAWINGS

Embodiments are illustrated by way of example and not limitation in the FIGS. of the accompanying drawing, and in which:

FIG. 4b is a rear left side perspective view of the stacked two-part system board system illustrated in FIG. 4a;

FIG. 7 is a front left perspective view illustrating one embodiment of a system of temperature sensors used in the EVSE case to sense a near ambient or reference temperature and the temperature near a receptacle plug blade assembly;

FIG. 8 is a front right perspective view illustrating the temperature sensor system illustrated in FIG. 7;

FIG. 9 is a left plan view of the temperature sensor system illustrated in FIGS. 7 and 8;

DETAILED DESCRIPTION

FIGS. 1b-e show an embodiment of a system with an electric vehicle supply equipment EVSE, power outlet and protective enclosure, where the EVSE is sized and configured to fit within, or at least substantially within, a protective enclosure when connected to a power outlet. Further shown is the EVSE power cord being routed from the EVSE case within the protective enclosure out to a connector for providing power to an electric vehicle.

Figure 1A:
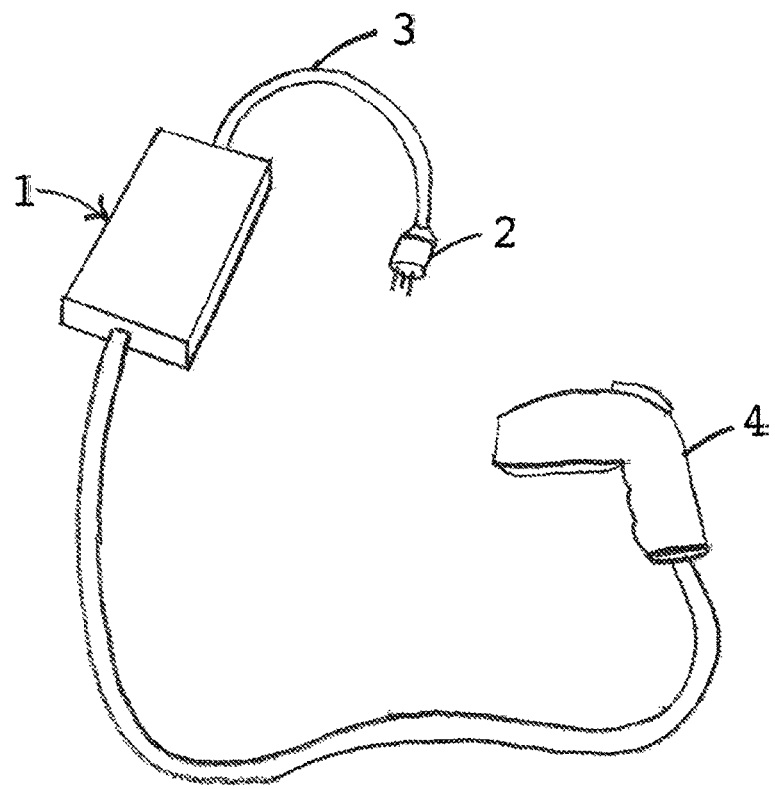
FIG. 1a is a prior art drawing of an EVSE system that has an EVSE case and enclosed controller and contactors remote from a receptacle plug blade assembly.
Figure 1B:
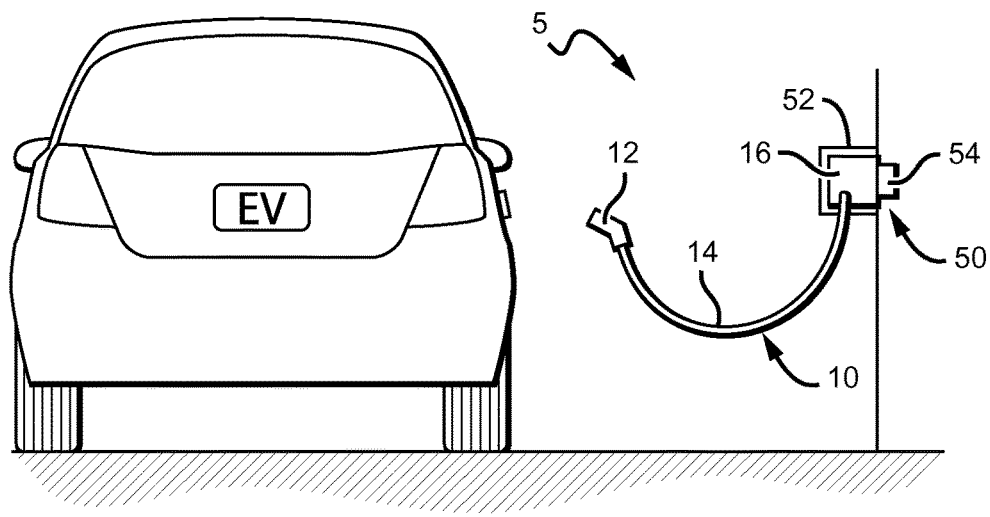
FIG. 1b is a system diagram illustrating one embodiment of an EVSE plugged into a power outlet with a protective cover to charge an EV.

FIG. 1b is a system diagram illustrating one embodiment of the EVSE plugged into a power outlet with a protective cover to charge an electric vehicle. In embodiments, the system 5 includes the EVSE 10 and the power source 50, where the EVSE 10 may be connected or plugged into the power source 50 and is capable of connecting to an electric vehicle. The EVSE 10 includes a connector 12 having electrical contacts for connecting to the electric vehicle, which in embodiments can be a J1772 compliant connector, a power and data cord 14, and a case or enclosure 16 for connecting to the power source 50. The power source 50 may include a power outlet 54 for connecting to the EVSE 10 and for providing power thereto, and a protective enclosure or cover 52 (alternatively an outdoor enclosure or cover, or weather enclosure or cover) for receiving the case 16 and at least a portion of the cord 14. For safety, the EVSE 10 functions to only supply power to the electric vehicle after it has been connected to the vehicle and received a signal indicating that the vehicle is ready to receive power from the EVSE 10. In this manner, and unlike a typical power cord, neither the electric contacts, the connector 12 nor the cable 14 is supplied power unless the EVSE 10 is properly connected to the vehicle. This is achieved by a set of contactors (alternatively called a "relay" or "relays") positioned in the case 16 that control the flow of power into the cord and connector. In embodiments, the set of contactors are two contactors, one inline with each of the two power lines or wires carrying power from the power outlet 54 or between the power source 50 and the EVSE 10. These contactors are operated by a control system which is also located within the case 16, and which is capable of communicating with the vehicle, or at least receiving signals from the vehicle, via a data or pilot line contained within the cable 14 and which is connected to the vehicle when the connector 12 is connected to the electric vehicle. The EVSE control system includes a contactor tester that can determine if the contactor is open or closed allowing the EVSE to provide a warning if a contactor is not in its proper or commanded state. The EVSE's contactor tester allows the EVSE to utilize a minimum of two contactors and thereby reduce the overall size of the case of the EVSE such that the case will fit within the protective cover 52. The protective cover 52 can be any of a variety of commercially available outdoor plug enclosures, with the case 16 being sized and shaped to fit within and/or be received by such commercial enclosures, such that each of external dimensions of the case 16 are less than the smallest corresponding internal dimensions and volumes of the commercially available outdoor plug enclosures, or a majority or substantial number of such enclosures. In embodiments, the case 16 is sized and shaped to define a void or empty volume between the case 16 and the protective cover 52, which can be utilized to receive a portion of the cable 14, such that that portion of the cable 14 can be maneuvered within the protective cover 52. The maneuvering of the portion of cable 14 within the void can facilitate positioning the cable 14 to exit an opening in the cover 52 and/or to allow the case 16 to be set in alternative positions, such as being inverted to be plugged into an inverted or 'hospital' configuration or orientation of the power outlet 54 (such as that shown in FIG. 1f).

Figure 1C:
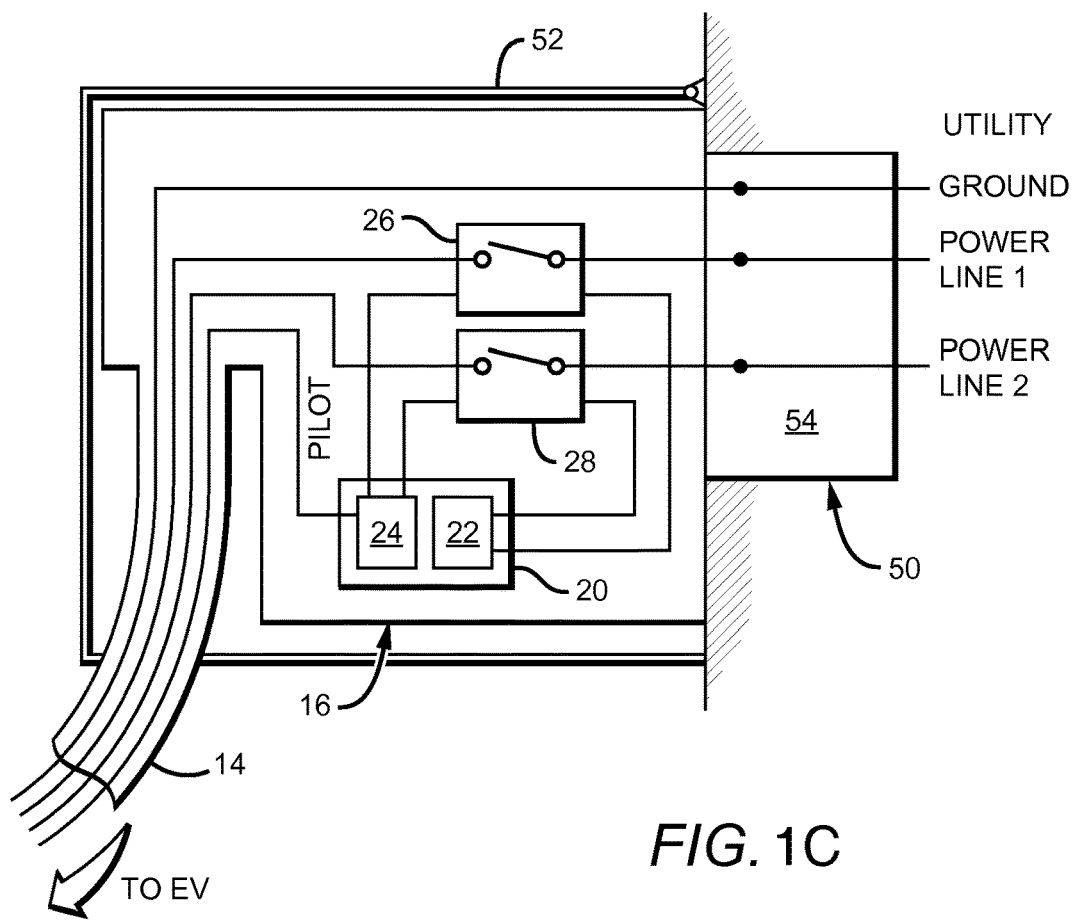
FIG. 1c is a cross-sectional side view of an embodiment of an EVSE and power outlet and protective enclosure.

FIG. 1c is a cross-sectional side view and schematic of an embodiment of an EVSE, power outlet and protective enclosure. In embodiments, the EVSE 10 includes the cord 14 and the case 16 and is shown plugged into the power outlet 54 of the power source 50 and within the protective cover 52. The EVSE 10 shown includes a control system 20 that is connected to a pilot line, which in turn may be connected to an electric vehicle via the connector 12 (not shown). The control system 20 is further connected to a set of contactors, relays or switches 26 and 28, which function to control the flow of power from the power source 50 to the vehicle. The control system 20 operates to open or close the contactor 26 and/or 28 as directed by the status of the pilot signal on the pilot line, including as directed by the vehicle or when the pilot line is disconnected from the vehicle. The control system 20 can include a contactor controller 22 and a contactor monitor 24. The contactor controller 22 controls the operation of the contactor 26 and/or 28. The contactor monitor 24 checks that the operation or position of contactor 26 and/or 28 matches their commanded position or positions. In the event the contactor monitor 24 detects that either contactor 26 and/or 28 are not functioning as commanded, the contactor monitor 24 will indicate an error has occurred in the operation of the EVSE 10. Such indication may be by illuminating a warning light (such as light 212).

As shown in FIGS. 1b and c, by positioning the case 16, and more specifically the contactors 26 and 28 at, adjacent, substantially abutting, or at least near the outlet 54 of the power supply 50, the remaining portion of the EVSE 10 after the contactors 26 and 28 will not have power or otherwise be energized, until and unless the EVSE 10 is connected to the vehicle and is provided a command to allow power to flow past the connectors 26 and 28, That is, this configuration of the EVSE 10, maximizes safety by minimizing, or reducing, the portion of the EVSE 10 that is energized without a the EVSE 10 being commanded by the vehicle to provide power thereto. Prior EVSEs were not as safe, as the cases containing the power relays were positioned along the power cord a distance from the power outlet, such that a substantial length of the cord separated relays from the power outlet, as such this section of the cord always energized when the EVSE was plugged into the outlet, regardless of the operation of the relays.

Figure 1D:
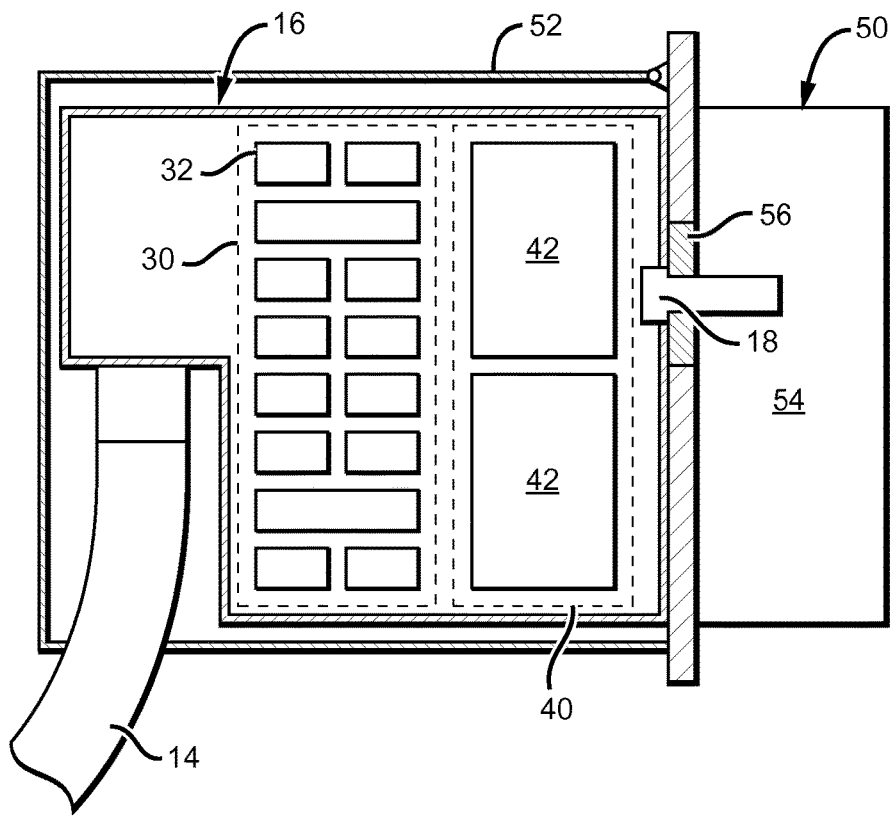
FIG. 1d is a cross-sectional side view of an embodiment of an EVSE and power outlet and protective enclosure.
Figure 1E:
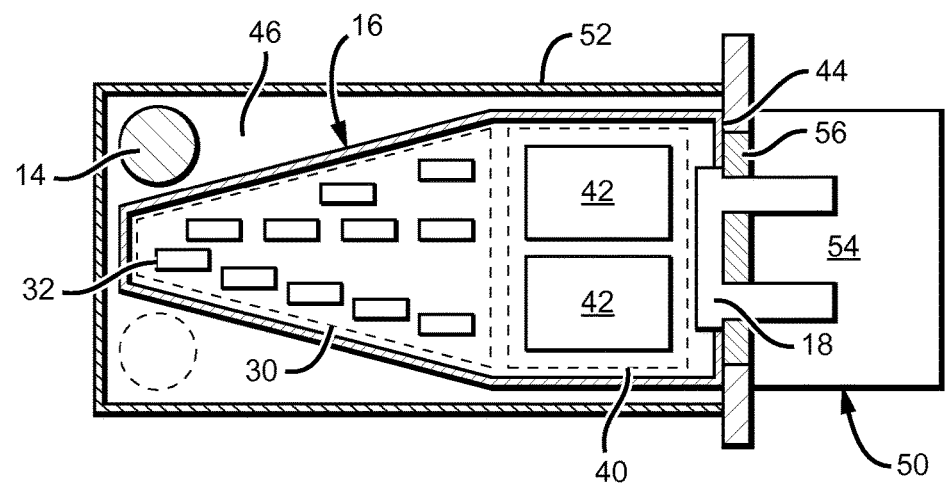
FIG. 1e is a cross-sectional top view of an embodiment of an EVSE and power outlet and protective enclosure.
Figure 1F:
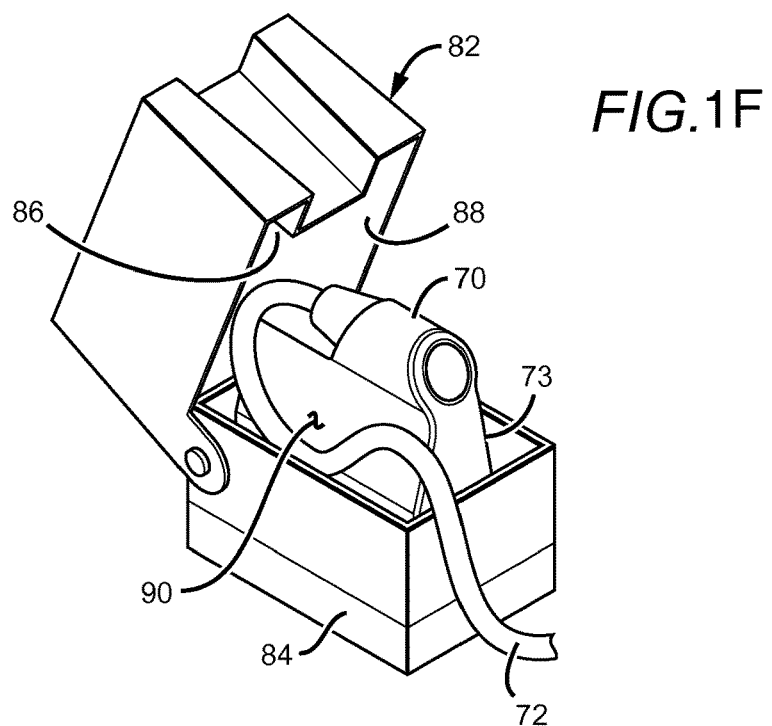
FIG. 1f is a perspective view of an embodiment of an EVSE and power outlet and protective enclosure.

FIGS. 1d and 1e are side and top block diagrams, respectfully, of an embodiment of an EVSE, power outlet and protective enclosure. In embodiments, the case 16 includes a connector or plug 18 that can be received by the power outlet 56 of the power source. The internal volume of case 16 includes a narrow region 30 that is sized to contain smaller components 32 of the control and power systems of the EVSE, such as processors, resistors and the like. The internal volume further includes a wider region 40 which is sized to contain larger components 42 of the control and power systems of the EVSE, such as contactors, relays, switches and the like. The narrow and wider regions (30, 40) may collectively form an interior tapered electronics volume that extends away from a front plug face 44 and that contains various electrical components of the EVSE. When enclosed by a protective cover 52, the volume not otherwise encompassed by the case 16 and its interior tapered electronics volume, defines an expanding volume 46 complementary to the case 16 and its interior tapered electronics volume. By positioning the smaller components of the EVSE in a defined region of the case 16, the case 16 can be made smaller or narrower at that location and allow a space (i.e., the expanding volume 46) to be defined within the protective cover 52 that is large enough to allow a portion of the cord 14 to be positioned adjacent to the case 16. In this manner the cord 14 can be positioned to allow or facilitate use with the protective cover 52, for example the cord 14 may have to be doubled back to reach the pass-through or opening of the protective cover 52, as shown in FIG. 1f. FIG. 1f shows an EVSE case 70 positioned within a protective cover 82 of an outdoor plug enclosure coupled to a power outlet 84, with the cord 72 doubled back through a space 90 that is defined by the narrow region 73 of case 70 and the internal walls 88 of the cover 82. This allows the cord 72 to be positioned to pass through the opening 86 when the cover 82 is in the closed position. The defined space 90 also allows the case 70 to be positioned in alternative orientations, such as upside down, in order to connect with power outlets of various orientations (such as a 'hospital' configuration).

Figure 2A:
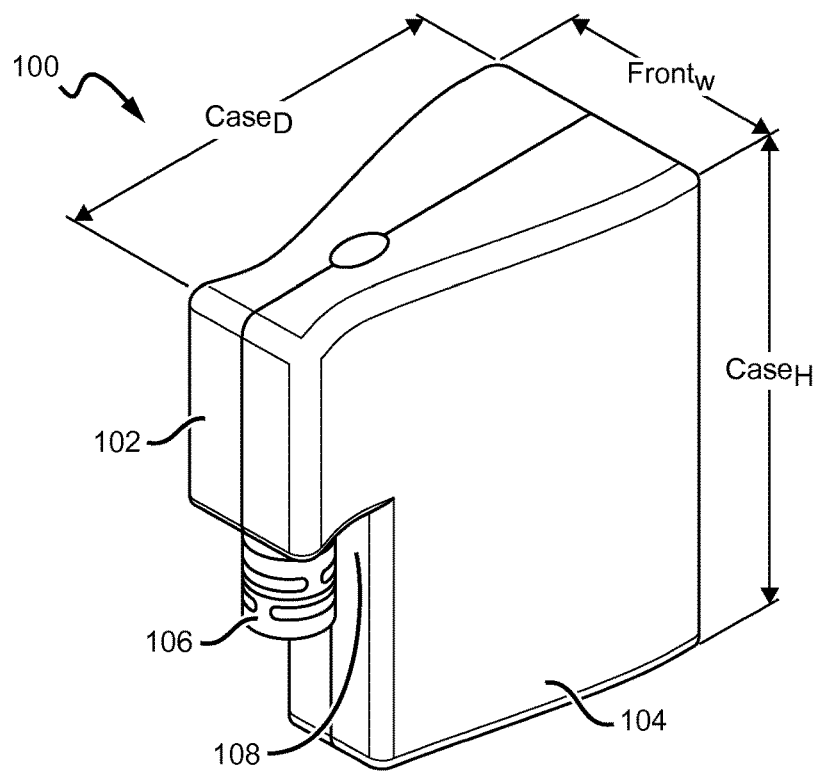
FIG. 2a is a perspective view of one embodiment of an EVSE case that has left and right gripping sides forming an acute angle of less than 72° with the front plug face to facilitate use with common outdoor plug enclosures.
Figure 2B:
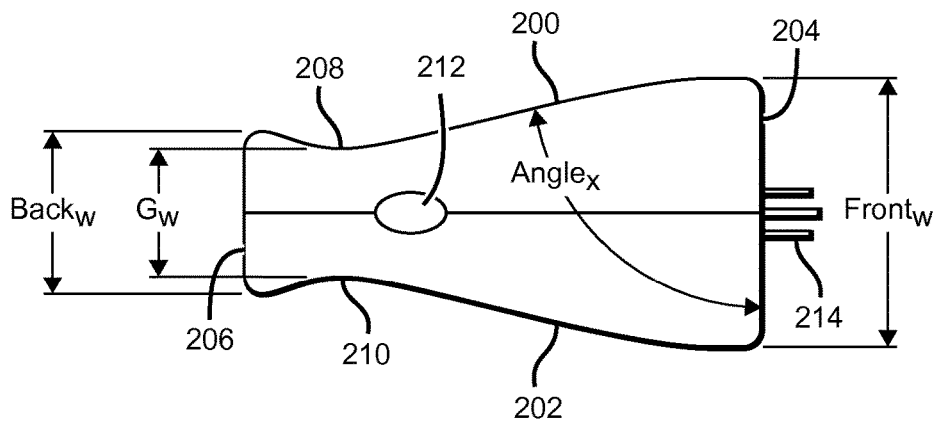
FIG. 2b is a top plan view of the EVSE case illustrated in FIG. 1.
Figure 3:
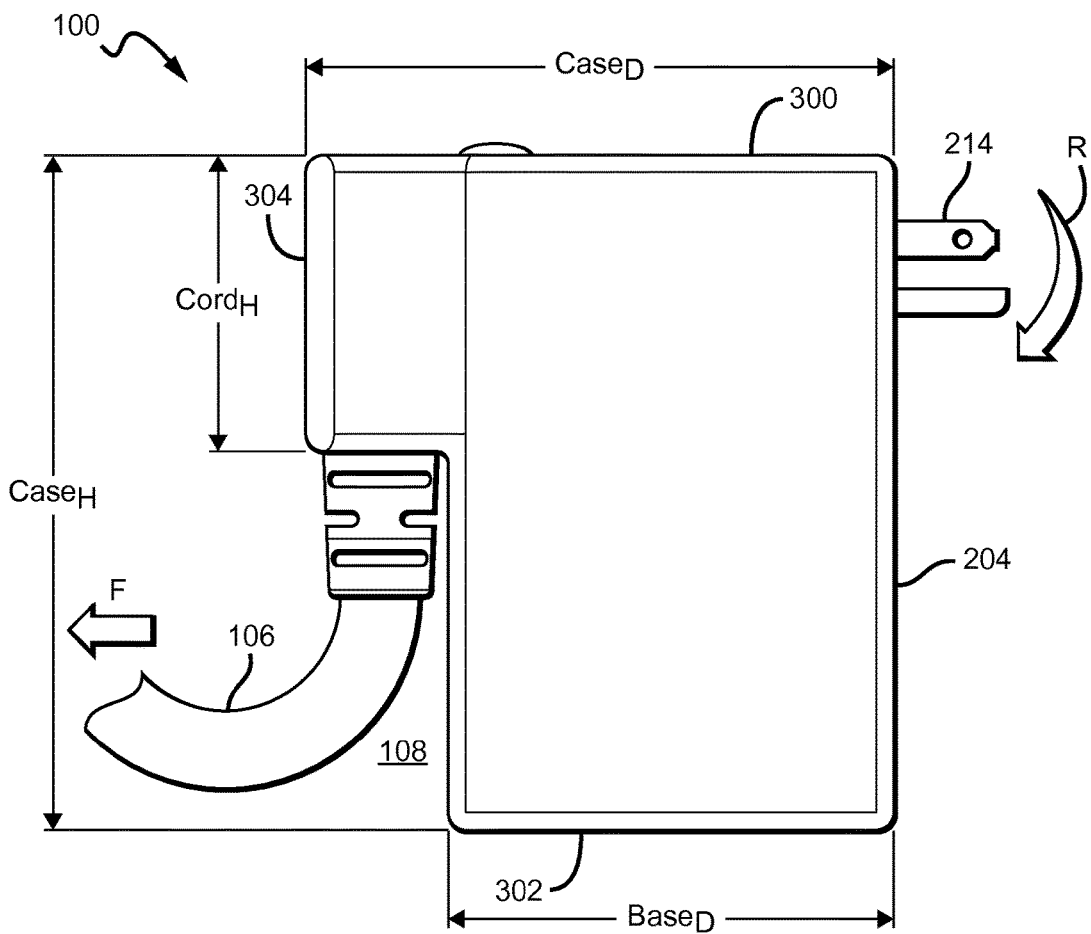
FIG. 3 is a side view of the EVSE case illustrated in FIG. 1.
Figure 4A:
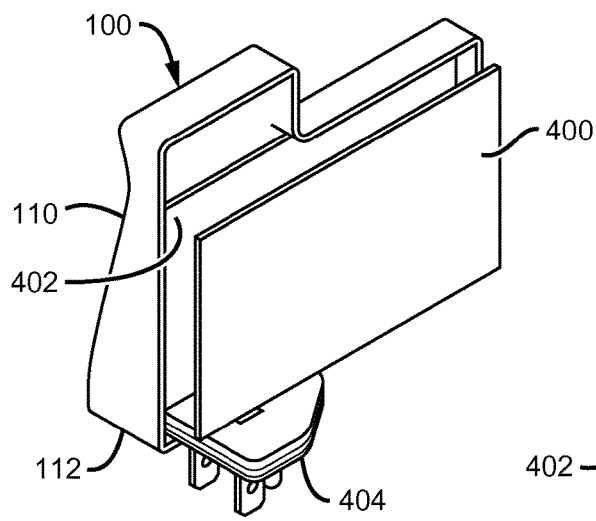
FIG. 4a is a front left perspective view of one embodiment of a EVSE case containing a stacked two-part system board system to promote unit size reduction and manufacturing efficiencies of components.
Figure 4B:
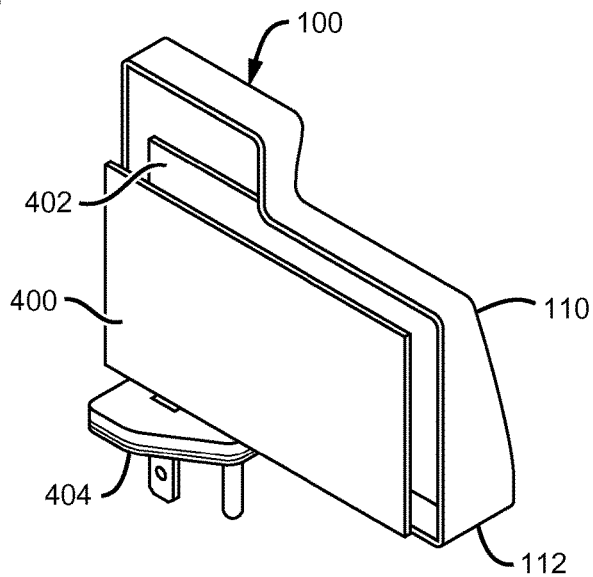

FIGS. 2a, 2b and 3 illustrate different views of an EVSE case. More particularly, FIG. 2a is a perspective view of one embodiment of an EVSE case 100 suitable for use with a variety of common outdoor plug enclosures. The case 100 has two case housing shells (102, 104), with a case height ($Case_H$) and a case front width ($Front_W$) that may generally approximate the front dimensions of an outdoor plug enclosure. A case depth ($Case_D$) may generally approximate the interior depth of an outdoor plug enclosure that provides power while-in-use protection from the environment so that the EVSE case 100 may fit inside an outdoor plug enclosure while closed.

The power and signal cabling 106 may be manufactured as a molded subassembly and hardwired to other components in the EVSE case 100 to extend longitudinally from an interior to an exterior of the EVSE case 100 at a base cutout 108. The location of connection of the cable 106 (shown as including a strain relief apparatus positioned about the cable) with the case 100 is positioned at least generally behind, or in line with the plug 214, such that the displacement or lever arm for the force imparted or otherwise applied onto the case 100 by the cable 106, such as that occurring by a lateral or outwards pulling on the cable 106, is minimized, thus in turn minimizing any torsional force or moment placed on to the case 100. This reduction of moment force on the EVSE, in turn will reduce or prevent rotation of the device out of a power outlet (not shown), such as that shown by arrow R, and/or reduce the forces and moments applied to the power outlet by the device by forces, such as that shown as force F, being applied to the cable 106. In embodiments, the length of $Cord_H$, as shown in FIG. 3, is such that the location of cable 106 connection to the case 100 is in-line, generally in-line or at least substantially in-line with the plug 214. Also, in embodiments, the case length $Case_D$ is minimized to further reduce the imparting of moment forces on the case 100 and onto the power outlet by the EVSE.

FIG. 2b is a top plan view illustrating left and right gripping sides (200, 202) that, with a front plug face 204 and rear face 206, collectively form a trapezoidal prism cross section with left and right convex gripping portions (208, 210) on left and right gripping sides, respectively (200, 202). Left and right gripping sides (200, 202) may form an acute angle $Angle_X$ of less than 72° with the front plug face 204 to enable a front cover of a typical commercially available exterior outdoor plug cover or enclosure (such as those shown in FIGS. 21A and B) to fully open and accept the EVSE case 100. In embodiments, the $Angle_X$ can vary to match or correspond to the angle of the outdoor outlet cover, such as being greater that 45°, between 45° and 90°, between about 60° and 80° and about 70° to 80, and about or substantially 72°. Consequently, the front plug face 204 may be of a smaller length than the rear face 206. In one embodiment, the left and right convex gripping portions (208, 210) form a ledge or other indentation that is thinner than the rear face 206 to enable a user to better grip the left and right convex gripping portions (208, 210) to pull the EVSE case 100 out of an outdoor plug enclosure. LED light 212 may be presented to an exterior of the EVSE case 100 to provide a user interface for the user.

FIG. 3 illustrates a side view of the EVSE case 100 illustrated in FIG. 2. The power and signal cabling 106 may extend longitudinally out from an interior of the EVSE case 100 through a conning tower 304 (alternatively, a raised or extended section 304 for receiving the cable 106) at an orientation that is initially perpendicular to the front plug face 204. The cabling 106 may extend in a direction opposite from a top surface 300 of the EVSE case 100 prior to reaching a radius of curvature bounded by a bottom plug face 302 to enable the remainder of the power and signaling cable 106 to flex outwardly from the body of the EVSE case 100 in any direction.

The shape of the EVSE case 100 may be determined from the available volume envelope of the most common outdoor plug in enclosure types. In one exemplary design, the EVSE case 100 is designed to be inserted into an outdoor plug enclosure for Level 1 and 2 charging, and the case may have the following dimensions according to Table 1 (dimensions given in inches).

TABLE 1

| | |
|---|---|
| $Back_W$ | 0.5-2 |
| $G_W$ | 0.625-1.0 |
| $Front_W$ | 1.5-2.125 |
| $Case_H$ | 3.0-4.0 |
| $Cord_H$ | 1.0-2.2 |
| $Case_D$ | 2.5-4.75 |
| $Base_D$ | 2-3 |

In another embodiment of a EVSE case 100 defining a trapezoidal prism, the rear face 206 is not parallel with the front plug face 204 but has a maximum length CaseD.

Figure 20:
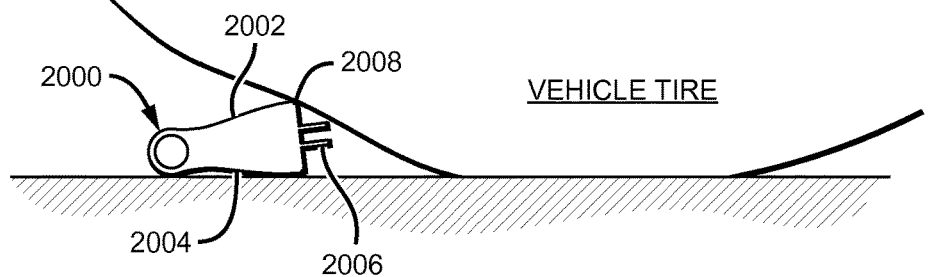
FIG. 20 is a side view of an embodiment being ran over by the tire of a vehicle.

With these dimensions, essentially long and parallel in aspect ratio with respect to the direction of the plug blades, the unit will be less likely to be positioned with the plug blades facing up if the device is placed or is dropped on the ground. This aspect ratio will therefore prevent in most instances the blades from being stepped on or driven over perpendicular to the blades' longitudinal axis, thus reducing the opportunity for irreparably damaged blades that may result in an inoperable or unsafe device. As shown in FIG. 20, the EVSE 2000 is laying on its side 2004 as the tire of a vehicle drives over the EVSE 2000. The corner 2008 receives the tire and thus creates a space for the plug assembly 2006 such that the plug 2006 is not contacted (or at least limited contact) or damaged (at least not substantially damaged) by the tire.

FIGS. 4a, 4b, 5 and 6 illustrate a two-part system board, including a power board and a control/sensing board in the EVSE case 100 to promote unit size reduction. More particularly, FIGS. 4a and b are front left and rear left side perspective views illustrating a power board 400 stacked on a logic board 402. The logic board 402 may have processors or specialized control circuits for controlling the power board 400. In another embodiment, the board stack positions are reversed. The separation of logic controls on one board and power elements on the other board allows for the design of multiple control boards that may connect to a family of power boards. This provides the capability of using different processors or specialized control circuits for particular applications. For example, the logic board 402 may be programmed to be operable with different power boards, thereby allowing economy of scale with respect to the manufacturer and assembly of control boards, while allowing for greater customization of power boards. In alternative embodiments, one or both of the power board 400 and logic board 402 may be split into two or more boards for assembly into the EVSE case 100.

The power board 400 is in electrical communication with a plug assembly 404 that may be detachably coupled to the EVSE case 100. The plug assembly 404 may be configured with a resister (not shown) or other electrical component that may sensed by the power board or control board to identify the plug assembly 404 for use with a particular countries electrical plug configuration. If the power board 400 is to be sold and used in one country, for example, a plug assembly may be provided by the manufacturer, distributor or retailer that is configured for that country, and the power or control board may automatically identify the included plug assembly 404 by means of the resistor or other electrical component to properly configuration output of the EVSE accordingly. In an alternative embodiment, the plug assembly 404 may be provided with a physical identifier that may be read by the EVSE to identify the physical configuration of the plug assembly 404 to properly drive output of the EVSE according to the country or region in which it is sold and used.

Figure 5A:
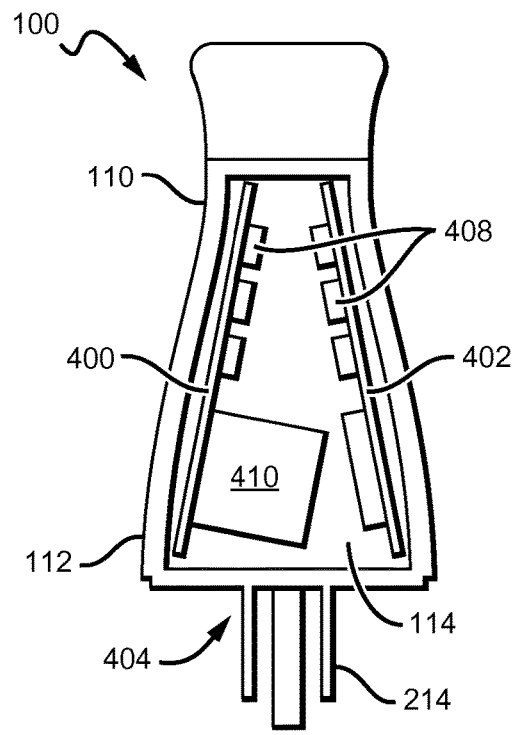
FIGS. 5a and b are cross-sectional views embodiments of a EVSE case containing a stacked two-part system board system to promote unit size reduction and manufacturing efficiencies of components.
Figure 5B:
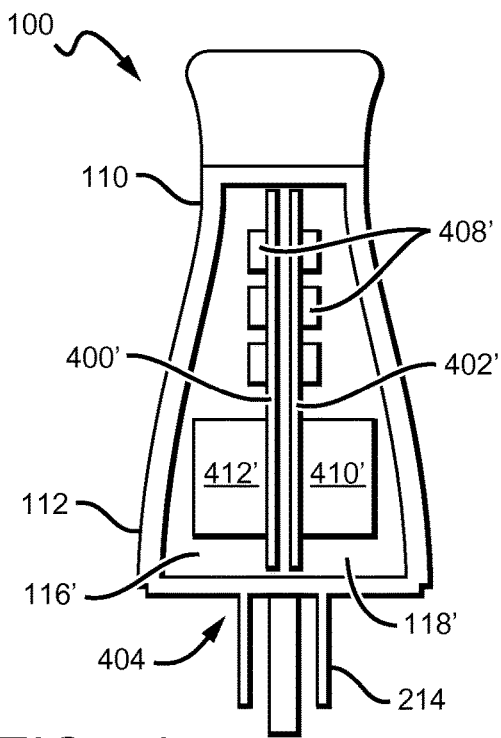

FIGS. 5a and b are cross-sectional views of embodiments of the EVSE with the control and power boards positioned in alternative ways. The position of these cross-sections are indicated by the line 5-5 in FIG. 6. In both FIGS. 5a and b, the larger components of the boards are positioned near the wider portions 112 of the case 100. In FIG. 5a the power board 400 and the control board 402 are positioned generally aligned with the external walls of the case 100, such that a larger space 114 is defined within or near the wider portion 112, then that of the narrower portion 110. This space 114 allows for the positioning of larger components, such as component 410, of the boards 400 and 402, while minimizing the overall volume of the case 100, by positioning the smaller components 408 within or near to the narrower portion 110. Such larger components may include the power contactors or relays, and the like. FIG. 5b shows another embodiment wherein the power board 400' and the control board 402' are positioned generally aligned and centered in the case 100. In this configuration the larger components 410' and 412' are positioned in the larger spaces 116' and 118', with the smaller components 408' in the narrower portion 110.

Figure 6:
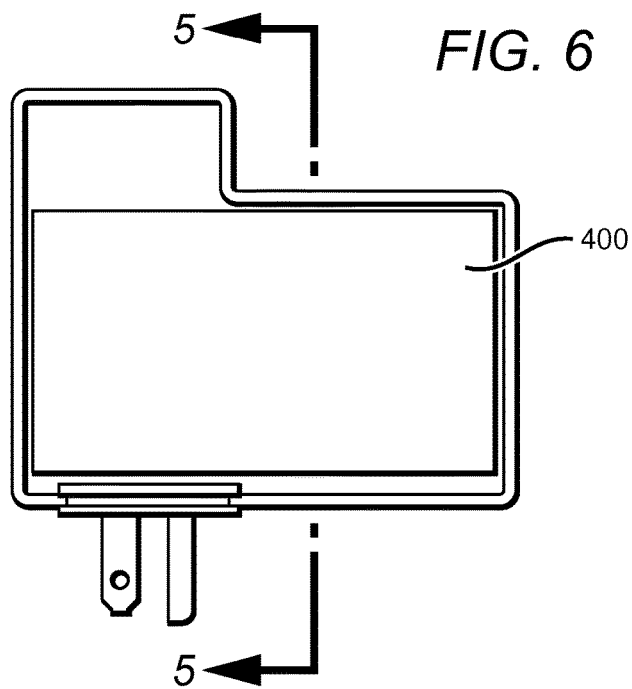
FIG. 6 is a left plan view of the stacked two-part system board system illustrated in FIGS. 4 and 5.

FIG. 6 is a left side plan view illustrating the power board 400 filling substantially all of the EVSE case 100. In an alternative embodiment, either or both of the power board 400 and the logic board 402 may extend only partially through the EVSE case 100.

In an alternative embodiment, the separation of logic controls on one board and power elements on the other board allows for the design of a power board that may connect to a family of control boards. This provides the capability of using different processors or specialized control circuits for particular applications. For example, the power board 400 may be configured to operate with a particular voltage, allowing economy of scale with respect to the manufacturer and assembly of power boards. For example, while 240V may be available in both the United States and Europe, different EV standards may necessitate particular control boards for that single power board design.

FIGS. 7, 8, and 9 illustrate front left and rear left side perspective views and a left plan view, respectively, with each view illustrating temperature sensors for sensing a reference temperature and the temperature near a receptacle plug blade assembly. In FIG. 7, the receptacle plug blade assembly 700 has power and neutral plug blades (702, 704) and a grounding pin 706. A plug blade temperature sensor, such as a plug blade temperature thermistor 708, may be seated on the power board 400 and in thermal communication with the power and neutral plug blades (702, 704). In one embodiment, the plug blade temperature thermistor 708 may be embedded in a potting material in contact with the power and neutral plug blades (702, 704), to monitor the receptacle plug blade assembly 700 for any significant temperature rise that may be indicative of a faulty connection. For example, a primary indication of a faulty connection between either of the blades and an AC receptacle is heat experienced at the plug blade assembly 700. This heat may be generated by the load current passing through a high impedance caused by the bad socket connection. The bad socket connection may be the result of damaged contact surfaces, small contact points, or foreign material that is not very conductive. The surfaces of the power and neutral plug blades (702, 704) may be damaged by oxidation due to heat or chemical contamination. This can result in a surface that is oxidized or sulfated and the contact resistance increases with this condition. A plug blade that is deformed may have a very small point of contact between the plug and socket pins. In this case, the entire load current must pass through a small cross section of metal and this increases the local heating of that section of the AC plug. The presence of a foreign material on the contact surfaces may also cause a smaller point-to-point area that may also result in a localized hot spot. Heat generated by any of these problems can result in a thermal runaway condition in which, as the heat continues to be generated, the blade gets worse over time and the problem escalates until a dangerous level may be reached which may result in the receptacle plug blade assembly melting or combustion occurring. In order to detect such a condition, in one embodiment, the plug blade temperature thermistor 708 is seated in potting material between and immediately adjacent to the power and neutral plug blades (702, 704). The heat that is experienced by the socket will be conducted to either or both of the power and neutral plug blades (702, 704) resulting in an increase in the temperature sensed by the plug blade temperature thermistor 708. In a non-preferred alternative embodiment, the plug blade temperature thermistor 708 is positioned at a point that is not approximately equidistant between the power and neutral plug blades (702, 704), but rather is positioned closer to one or the other of the power and neutral plug blades (702, 704).

A plug reference temperature sensor that is a reference temperature thermistor 710 may be seated on the power board 400 or on the logic board 402 and positioned remotely from the plug blade temperature thermistor 708 to provide differential temperature readings. In a preferred embodiment, the plug blade temperature thermistor 708 and reference temperature thermistor 710 are located as far away from each other as is practicable within the EVSE case to enable the reference temperature thermistor to measure near-ambient temperature conditions during operation. The enclosure, thermally conductive materials, and any local heating sources inherent in the system define the thermal gradient between the two sensors.

Figure 10:
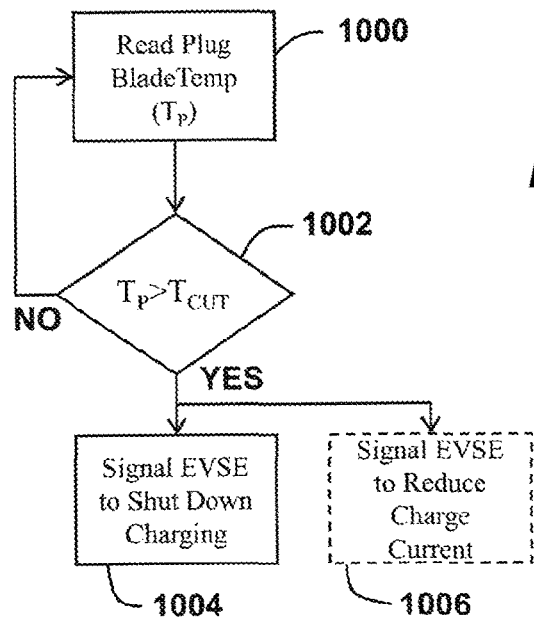
FIG. 10 is a flow diagram illustrating one embodiment of a means to avoid excessive heat that may cause damage to the receptacle plug blade assembly using measurement of the absolute temperature taken adjacent the plug blade assembly.

FIG. 10 is a flow diagram illustrating one embodiment of a means to avoid excessive heat that may cause damage to the receptacle plug blade assembly due to a faulty connection by using the absolute temperature measured immediately adjacent the blade assembly. A plug blade temperature ($T_P$) is read from the plug blade temperature thermistor that is positioned between the power and neutral plug blades (block 1000). If the sensor indicates the plug blade temperature ($T_P$) is greater than a predetermined cutoff temperature ($T_{CUT}$), the EVSE may respond by modifying the pilot signal to stop power drawn by the EV (block 1004). Otherwise, charging may continue and the plug blade temperature thermistor continues to monitor the plug blade temperature ($T_P$) for comparison against the predetermined cutoff temperature ($T_{CUT}$) (blocks 1000, 1002). The predetermined cutoff temperature ($T_{CUT}$) may be determined by the expectation of what normal operation at a worst-case reference temperature might be. For example, assuming a worst-case reference temperature of 70° C. and a chosen rise above reference temperature to be 40 C, then the predetermined cutoff temperature ($T_{CUT}$) would be 110° C. (40° C.+70° C.=110 C). In one embodiment, rather than shutting down charging, the EVSE responds by reducing, rather than eliminating, charge drawn by the EV (block 1006) through suitable modification of the pilot signal sent to the EV. In this embodiment, the EVSE modifies the pilot signal in response to measurements taken by the plug blade temperature thermistor without regard to the temperature indicated at the reference temperature thermistor.

Figure 11:
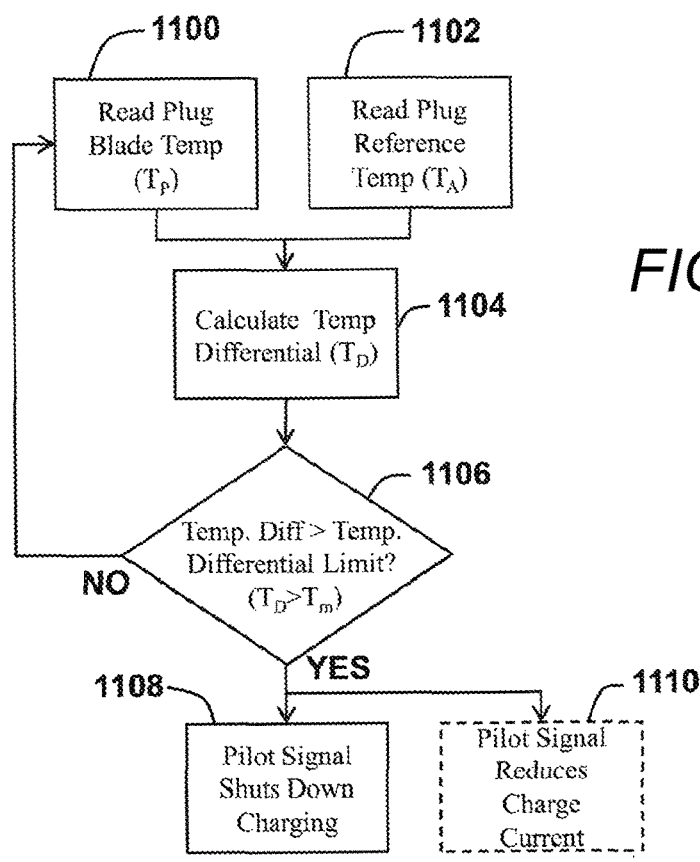
FIG. 11 is a flow diagram illustrating another embodiment of a means to avoid excessive heat that may cause damage to the receptacle plug blade assembly using temperature differential measurements.

FIG. 11 is a flow diagram illustrating one embodiment of a means to avoid excessive heat that may cause damage to the receptacle plug blade assembly by using a temperature differential calculated using measurements taken by the plug blade temperature thermistor and reference temperature thermistor. The plug blade temperature ($T_P$) is sensed by the plug blade temperature thermistor (block 1100) and the reference temperature is sensed by the reference temperature thermistor (block 1102). A temperature differential ($T_D$) is calculated (block 1104) and that calculated temperature differential ($T_D$) is compared against a predetermined temperature differential limit ($T_M$) (block 1106). The predetermined temperature differential limit ($T_M$) is decided on for a reading difference based on the expectation of the bad contact generating heat. In one embodiment, the predetermined temperature differential limit ($T_M$) may be 50° C. If the temperature differential ($T_D$) does not exceed the predetermined temperature differential limit ($T_M$), then the plug blade temperature and reference temperature sensors continue to monitor the receptacle plug blade and reference temperatures, respectively, and the temperature differential ($T_D$) continues to be compared against the temperature differential limit ($T_M$) (blocks 1100, 1104, 1106). If the temperature differential exceeds the temperature differential limit ($T_M$) (block 1106), then the EVSE may respond by sending a pilot signal that shuts down EVSE charging (block 1108). In an alternative embodiment, the EVSE may respond by sending a pilot signal that reduces charge current to the EV (block 1110). In such embodiments, the charge current reduction may be accomplished as a step function, a ramp function down to a steady-state reduction or such reduction in current may be proportional to the calculated temperature differential ($T_D$) such that the temperature differential ($T_D$) is maintained below the temperature differential limit ($T_M$) as result of active control of the charge current reduction. In one embodiment, more complex variations of this test may include the absolute temperature readings of the two sensors used as scalars of the temperature differential limit ($T_M$). In another embodiment, the rate of rise of a measured temperature at a temperature sensor may indicate the amount of wattage that is entering the system from the blade location. Because the EVSE has a specific thermal mass, the rate of rise of the overall body temperature will be defined by the blade temperature, reference temperature, enclosure physics and the amount of temperature increase in a given time span.

Figure 12:
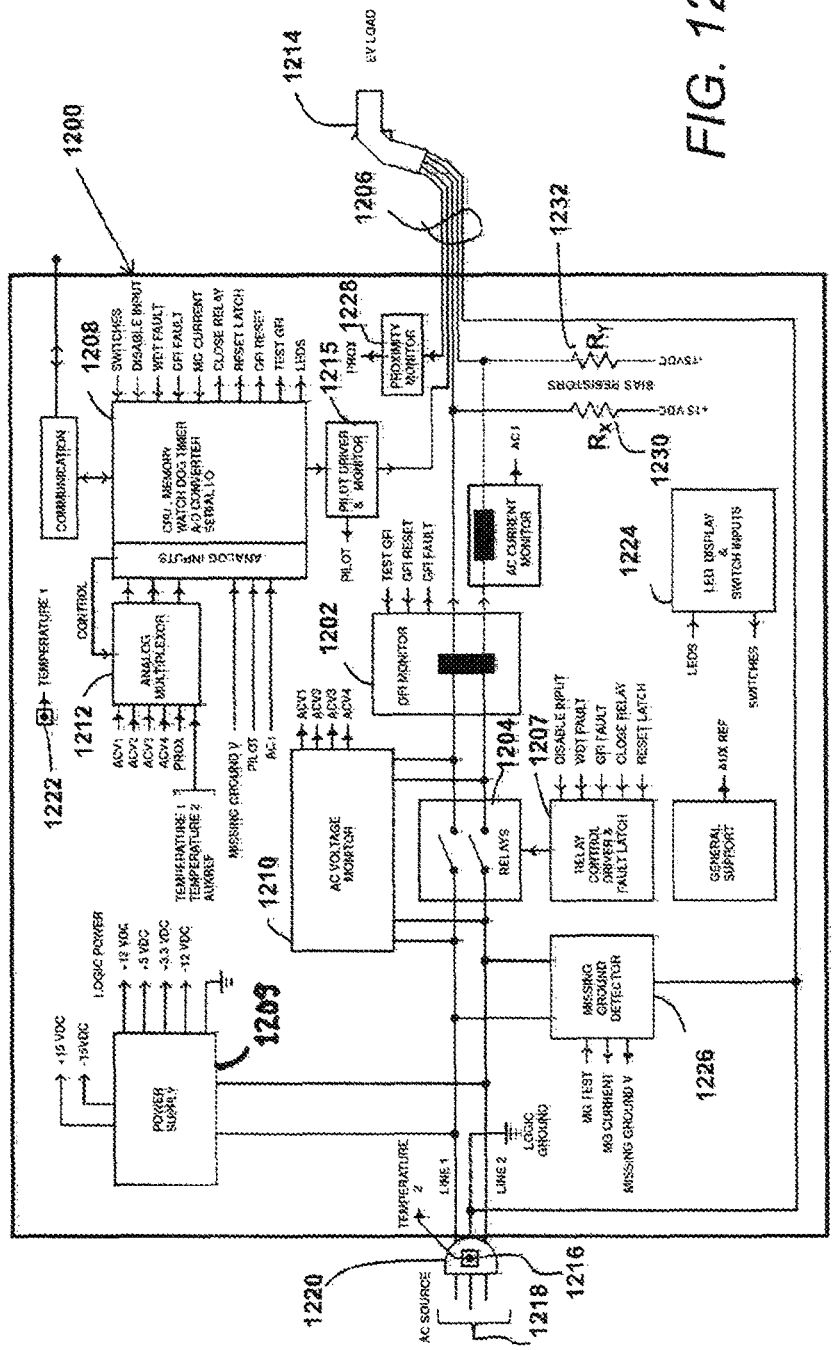
FIG. 12 is a block diagram illustrating one embodiment of an EVSE system.

FIG. 12 illustrates one embodiment of an EVSE system 1200 that uses AC utility power to charge electric vehicles. The system is operable to plug into an AC source that may be 120 VAC-60 Hz, 250 VAC-60 Hz (split phase) or 230 VAC 50 Hz (80 VAC to 264 VAC) via a standard NEMA or CEE7/7 plug from a standard household utility socket. The AC power is routed to a GFI Monitor 1202 that is a GFI/RCD (Ground Fault Interrupter/Residual Current Device current sensor) through relays 1204 for presentation to an EV charge cable 1206. The relays 1204 are normally open (N. O.) when de-energized, so logic power must be present in order to initiate and maintain the relay-closed condition. The mechanical relays open/close operation is driven by the relay control driver and fault latch 1207. The GFI monitor 1202 relay control driver and fault latch controller 1207 collectively provide a robust hardware safety system. A controller 1208 receives line voltage signals from an AC voltage monitor 1210 through an analog multiplexor 1212, with the AC voltage monitor 1210 monitoring the voltage on Line 1 and Line 2 and across the relays 1204 for communication to the controller 1208. The controller 1208 includes a microprocessor and control monitoring electronics, with logic power being supplied by a POWER SUPPLY 1209 that may be a flyback transformer based power supply to allow for use of the EVSE system 1200 in different power environments. The prime function of the controller 1208 is to use the inputs from the vehicle connector and utility to allow or disallow the relays to open and close. It allows closure when conditions are normal and ensures the relays open in any safety required fault or disconnection event. It obtains its operating power from the utility at the input of the EVSE system 1200.

A charge coupler 1214 such as an SAE-J1772 or IEC-62196 Type II, Mode 2 compliant connector is in communication with the EV charge cable 1206 to feed the AC power to an EV (not shown) that may be coupled to the charge coupler. The EV (now shown) may contain an on-board charger that then converts the AC power to DC power to charge the vehicle batteries. For example, in preparation to operate the EVSE system 1200, the connector is attached by the user to the vehicle receptacle for charging sessions. The vehicle is the primary system component per SAE-J1772/IEC62196 that communicates charging status and completion to the user, however the controller 1208 may be designed to provide a primary pilot signal through the pilot driver and monitor 1215, with the pilot signal established between the EVSE and the vehicle per SAE-J1772 prior to closing the relays 1204. The pilot signal is passed through the charge cable 1206 to the vehicle, and may have a peak amplitude of +/−12 V and a PWM (Pulse Width Modulation). Per SAE-J1772, the duty cycle of the pilot PWM signal is used by the EVSE system 1200 to communicate the maximum power amperage limit that the EVSE system 1200 may supply to the vehicle. The pilot signal voltage amplitude and modulation characteristics are used to indicate a proper connection, charging requirements and default status between the vehicle and the EVSE system 1200.

Also included in the EVSE system 1200 may be a plug blade temperature thermistor 1216 positioned and potted in thermal communication with plug blades 1218 of a receptacle plug blade assembly 1220, with the plug blade temperature thermistor 1216 in communication with the controller 1208. A reference temperature thermistor 1222 is positioned remotely from the plug blade temperature thermistor 1216 to enable measurement of differential temperatures at such locations, and is also in communication with the controller 1208. With inclusion of the plug blade temperature thermistor 1216 and reference temperature thermistor 1222, means are provide for avoiding excessive heat that may cause damage to the receptacle plug blade assembly by using either an absolute temperature as measured at the receptacle plug blade assembly or a temperature differential calculated using measurements taken by the plug blade temperature thermistor and reference temperature thermistor to enable intelligent control of the EV charging current through modulation of the pilot signal sent by the controller 1208.

The EVSE system 1200 may have a user interface 1224 that may include an LED light or lights and one or more switch inputs that are in communication with the controller 1208. In one embodiment, the LED light is one green LED. When the EVSE system 1200 is not plugged into a wall outlet, the LED may be off. When the EVSE system 1200 is plugged into a wall outlet and is not charging (stand-by state) the LED may be solid on. During the charging state, the LED will display a smooth transition from fully on to barely visible. The trouble codes may be depicted through various flash rates of the LED that will be distinctly different from the other states. Because the EVSE system 1200 is able to communicate through the charge coupler 1214, in one embodiment, the charge coupler 1214 maybe connected to a personal computer to configure the EVSE system 1200 for a maximum current rating for a particular region. Software embedded or otherwise stored and used by the controller 1208 may be updated through the charge coupler 1214 to make upgrades in the field very easy (see FIG. 13). Also included in the EVSE system 1200 is a missing ground detector 1226 in electrical communication with both line 1 and line 2 to provide missing ground current and missing ground voltage signals to the controller 1208. As shown more particularly in FIG. 17, a proximity monitor 1228 is in electrical communication with the charge coupler 1214 through the EV charge cable 1206 to enable EVSE programming such as that described in FIG. 13, below. A DC bias circuit is provided through bias resisters $R_X$ 1230 and $R_Y$ 1232 (preferably 300 k ohms, each) in electrical communication with Line 1 and Line 2, respectively, to enable bipolar output impedance and welded contact tests as described more fully, below.

Figure 13:
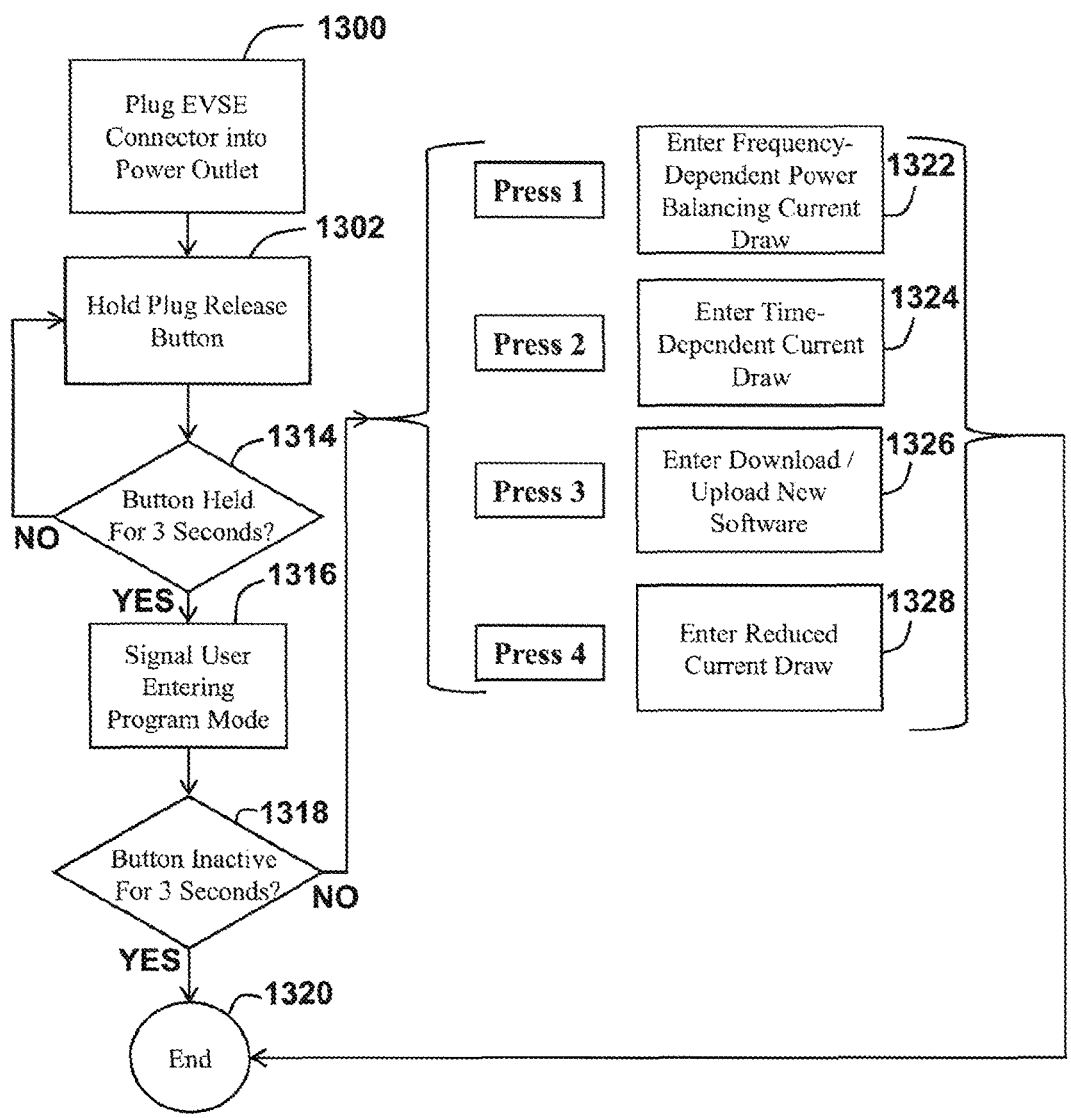
FIG. 13 is a flow diagram illustrating one embodiment of an EVSE programming method to enable a user to select frequency-dependent power balancing current draw, time-dependent current draw, to upload new software into the EVSE or to select a reduced current draw.

FIG. 13 illustrates a flow diagram of one embodiment of a system of using a plug release button on an EV connector and the user interface on the EVSE system to enable or program features of the EVSE system. An EVSE is plugged into an AC source (block 1300) and a user may hold a plug release button (block 1302). If the button is held for a predetermined period of time, such as 3 seconds (test 1314), then a signal may be sent to a user interface that the EVSE system is entering a program mode (block 1316). If the button is not held for 3 seconds prior to release (test 1314) then a controller of the EVSE continues to monitor for a signal indicating plug release activation (block 1302). Subsequent to entering the program mode (block 1316), the controller monitors the signal indicating plug release button activation and, if the button is inactive for 3 seconds (test 1318), program mode ends (block 1320). Otherwise, a user may press and release the plug release button a number of times to cycle through a variety of possible program operational modes or operational parameter set-value operational states. For example, if the user presses the plug release button one time and then releases for a period of over three seconds, the EVSE system may enter a frequency-dependent power balancing current draw mode (block 1322) wherein modulation of the pilot signal is dependent on a measured frequency of the AC utility power. In one embodiment, if the AC utility power frequency drops from 60 Hz to 50 Hz in either a 120 VAC-60 Hz or 250 VAC-60 Hz (split phase) utility power system, the EVSE system may drive the pilot signal to request a reduction in the maximum EV power draw from 100% to 60%. In another embodiment, if the user presses the plug release button twice within a period of three seconds (blocks 1322, 1324) and then releases the plug release button for more than three seconds (test 1318), the EVSE system may enter a time-dependent current draw program mode (block 1324). In this mode, the controller may provide a pilot signal to the EV that varies the EV maximum charge rate according to a local time schedule that minimizes the cost of charging the EV, such as by allowing maximum charging at night but restricting the EV maximum charge rate during more expensive day rates. In another embodiment, if the user presses the plug release button three times within a period of three seconds (blocks 1322, 1324, 1326) and then releases the plug release button for more than 3 seconds (test 1318), the EVSE system may enter a program mode to allow download or upload of new software into the controller of the EVSE system (block 1326). In one embodiment, the pilot voltage may be switched from voltages defined in SAE J1772, such as 6 V, 9 V, or 12 V, to a non-standard voltage that may be a carrier signal for data upload to the EVSE over the pilot voltage signal. In another embodiment, if the user presses the plug release button four times within a period of three seconds (blocks 1322, 1324, 1326, 1328) and then releases the plug release button for more than 3 seconds (test 1318), the EVSE system may enter a program mode in which the controller may provide a pilot signal to the EV that reduces the EV maximum charge rate to 60%, 40%, or to another pre-determined rate (block 1328) to reduce the burden on the utility circuit in the case a known current constraint on the utility circuit. After entering each relevant program mode, the controller may return to monitoring the plug release button for indication of a further program mode change (block 1302) (test 1314). In each of the embodiments described, above, rather than pressing and releasing the plug release button to cycle through modes, the user may, in one embodiment, press and hold the plug release button while the controller enables stepping through the various available modes. In such an embodiment, the user may release the plug button when the desired programming mode has been presented, such as through a visual indication on the user interface, through an audible tone, or by another means. In addition to the programming modes and features described, above, other programming modes or features may be selected or activated using similar plug release button cycling.

Figure 14:
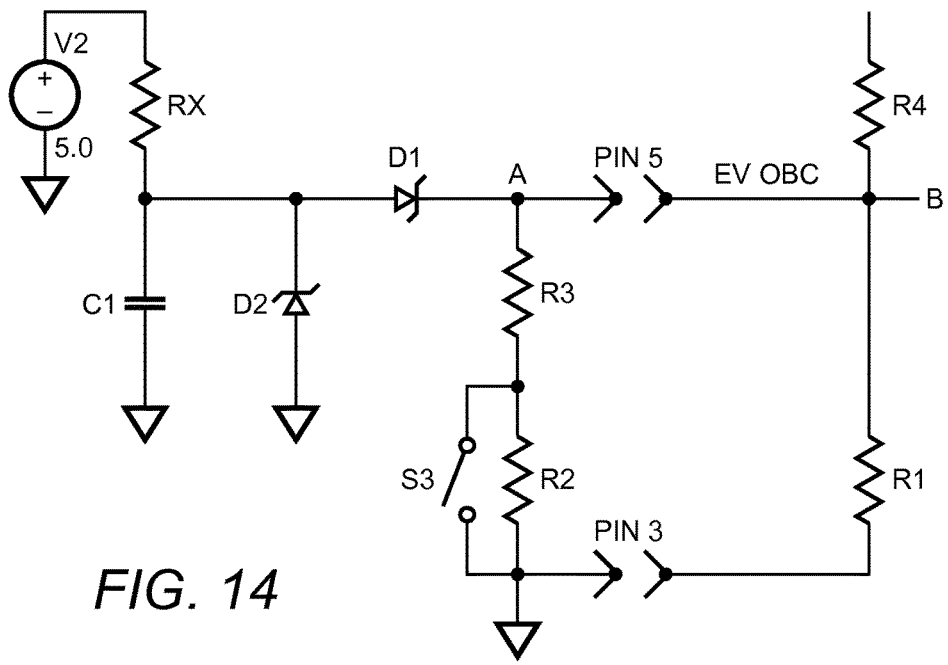
FIG. 14 is a schematic illustrating one embodiment of an EV plug proximity sense circuit that may be used to accomplish the EVSE programming method described in FIG. 13.

FIG. 14 is a schematic illustrating one embodiment of an EV plug proximity sense circuit that may be used to accomplish the EVSE programming method described in FIG. 13, according to the proximity monitor 1228 illustrated in FIG. 12. Referring to FIGS. 12 and 14, SAE J1772 provides for a plug insertion-removal identification method using a Proximity signal. The EV (not shown) uses a proximity circuit to detect when the EV's charging plug is being engaged or disengaged. This is accomplished through use of a switch S3 connected to the interlock mechanism (PINS 5 and 3) of the EV cable plug. The switch S3 signals the EV that the interlock mechanism is opened which means that a connect or disconnect of the EV's charging plug is in process. The EV controller 1208 then presumes that the load current as driven by the pilot driver & monitor 1215 should be discontinued so that an electric arc or spark will not occur if the power connection is broken. A secondary use of this signal allows the EVSE system 1200 to use the switch S3 to control EVSE program operation for added features. In one embodiment, a 5 VDC bias is applied to resistor R4 (preferably 330 ohms) which then branches out to R1 (preferably 2700 ohms) and to the R2-R3-S3 circuit in the plug (preferably 330 ohms and 150 ohms, respectively). The EV logic (not shown) looks at the signal voltage on node "B" and the EVSE looks at node "A" as received at the controller 1208 through the analog multiplexor 1212 and proximity monitor 1228. When the charge coupler 1214 is not inserted into the EV port, the voltage on node "B" is [+4.46 VDC]. This indicates to the EV controls that the plug is not inserted. When the charge coupler 1214 is inserted into the EV port, the added impedance changes the Proximity voltage to one of two levels. If the interlock mechanism is engaged, S3 is open and the node "A" and "B" voltage is [+2.76 VDC]. This indicates an insertion or removal event is in process. If the interlock mechanism is not engaged, S3 is closed and the node "A" and "B" voltage is [+1.51 VDC]. This indicates that the plug connection is stable. To sense the Proximity circuit (S3, R1-R4) without frustrating its normal operation, a high impedance analog to digital input is connected to node "A" (D1, D2, C1, RX). When the charge coupler 1214 is inserted into the EV port, the voltages are consistent with the previous values of;

Node "A"=[+2.76 VDC] open [+1.51 VDC] closed.
When the plug is not inserted into the EV port, the bias voltage from R4 is gone and the EVSE controller 1208 then can read the voltage drop that the V2+RX supply provides at the proximity monitor 1228. For this case, the S3 state conditions provide;

Node "A"=[+1.26 VDC] open [+0.60 VDC] closed.
The node "A" voltage may then indicates to the EVSE controller one of four charge coupler 1214 states as provided in Table 2.

TABLE 2

| Node "A" Voltage | Plug State |
| --- | --- |
| +2.76 VDC | Plug inserted into EV port, engagement mechanism is pushed |
| +1.51 VDC | Plug inserted into EV port, engagement mechanism is not pushed |
| +1.26 VDC | Plug not inserted into EV port, engagement mechanism is pushed |
| +0.60 VDC | Plug not inserted into EV port, engagement mechanism is not pushed |

From these voltage readings, the EVSE software may modify it's operation and provide useful operational features using the inherent Proximity switch and therefore without the need for additional control devices.

Figure 15:
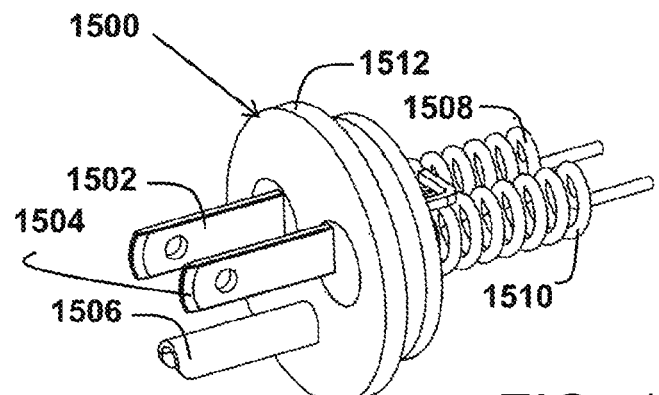
FIG. 15 is a front perspective view of an EVSE power plug assembly configurable to operate with National Electrical Manufacturers Association (NEMA) 5-15, 5-20, 6-15 and 6-20 standardized AC power receptacles, with the power and neutral plug blades rotated to illustrate use with a NEMA 5-15 AC power receptacle.

FIG. 15 is a front perspective view of an EVSE power plug assembly 1500 that is configurable to operate with NEMA 515, 520, 615 and 620 AC power receptacles based on the position of the neutral plug blade and in response to a detected voltage at the power plug blade. In FIG. 15, the power and neutral blades (1502, 1504) are rotatably coupled in the assembly 1500 to rotate between horizontal and vertical positions, such as the vertical positions illustrated in FIG. 17. The ground prong 1506 may remain fixed and non-rotatable with respect to the assembly 1500. A power cable 1508 and neutral cable 1510 are in electrical communication with the power and neutral blades (1502, 1504), respectively, and extend out the back of an assembly body 1512.

Figure 16:
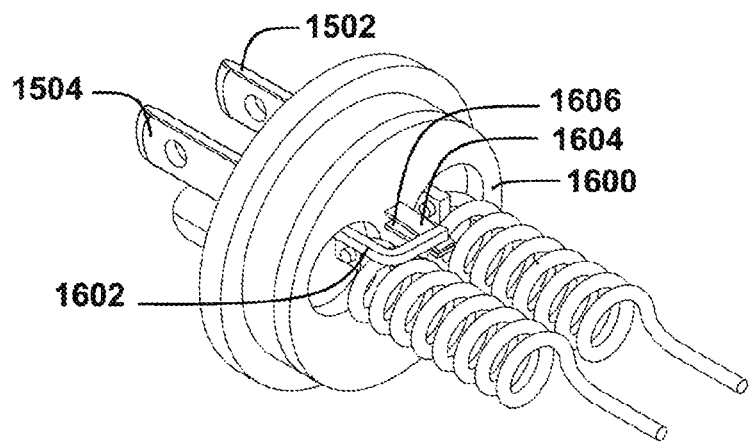
FIG. 16 is a rear perspective view of the EVSE power plug assembly illustrated in FIG. 14, with the power and neutral plug blades rotated to illustrate use with a NEMA 5-20 AC power receptacle.

In FIG. 16, the power and neutral cables (1508, 1510) are illustrated extending out from a back face 1600 of the assembly body 1512 for communication with a remainder of the EVSE system. A switch lever 1602 may be electrically coupled to the neutral blade 1504 and configured, such as through an elbow bend, to press on a first switch contact 1602 when the neutral blade 1504 has been rotated to the vertical orientation. The first switch contact 1604 is pushed by the switch lever 1602 to contact a second switch contact 1606, thereby completing a circuit between the first and second switch contacts (1604, 1606) and the controller 1208 (see FIG. 12) to enable the controller to detect the vertical orientation of the neutral blade, such as for use with NEMA 5-15 and NEMA 6-20 AC power receptacles (see Table 3). In one embodiment, the controller uses neutral blade orientation detection in combination with measurement of the voltage at the power blade 1502 to determine which of NEMA 5-15 or NEMA 6-20 AC power receptacles is being used by the EVSE power plug assembly 1500. For example, if the controller detects a vertical neutral blade 1504 as indicated by first and second switch contacts (1604, 1606) completing the circuit with the controller, and detects 120 V at the power blade 1502, then the controller may deduce that the power blade 1502 has been rotated to a vertical position and that the EVSE power plug assembly 1500 is plugged into a AC power receptacle defined by NEMA 5-15 (i.e., 120 V, 15 A) (see Table 3). This information may then be used by the controller to define a maximum EV charge rate as driven by the pilot signal. If the controller detects 240 V at the power blade 1502, the controller may deduce that the power blade had been rotated to the horizontal position (not shown) and that the EVSE power plug assembly 1500 was plugged into a NEMA 6-20 AC power receptacle (i.e., 240 V, 20 A) (see Table 3) for purposes of driving an appropriate pilot signal to an EV.

TABLE 3

| Standard | Neutral Blade Position (Detected) | Power Blade Position | Measured Voltage |
| --- | --- | --- | --- |
| NEMA 5-15 | Vertical | Vertical | 120 V |
| NEMA 5-20 | Horizontal | Vertical | 120 V |
| NEMA 6-15 | Horizontal | Horizontal | 240 V |
| NEMA 6-20 | Vertical | Horizontal | 240 V |

Figure 17:
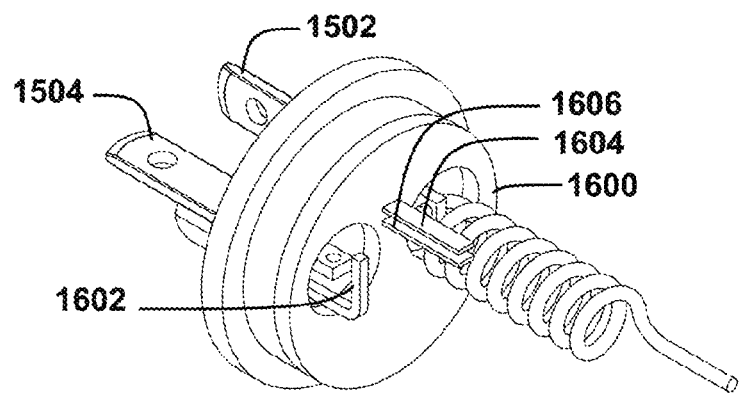
FIG. 17 is a rear perspective view of the EVSE power plug assembly illustrated in FIG. 14.

In FIG. 17, the neutral blade 1504 has been rotated by the user to a horizontal position with respect to the vertical power blade 1502, and so the switch lever 1602 has rotated off of the first switch contact 1604 to allow the first switch contact 1604 to return to its natural position parallel to and not in contact with the second switch contact 1606. The controller would thereby detect the horizontal position of the neutral blade as the circuit with the controller and first and second switch contacts (1604, 1606) is broken. Although the controller may not detect the position of the power blade 1502, if the controller detects 120 V at the power blade 1502, the controller would deduce that the EVSE power plug assembly 1500 is plugged into a NEMA 5-20 AC power receptacle (i.e., 120 V, 20 A) (see Table 2) and drive the pilot signal accordingly. Similarly, if the controller detects 240 V at the power blade 1502 and a horizontally-positioned neutral blade 1504, the controller may know that the EVSE power plug assembly 1500 is plugged into a NEMA 6-15 AC power receptacle (i.e., 240 V, 15 A) (see Table 2), although the controller does not directly monitor such orientation. In an alternative embodiment, third and fourth switch contacts may be provided to engage a switch arm coupled to the power blade to enable the controller to detect the power blade position. In other embodiments, switch contacts and a switch arm may be provided to detect only the power blade position.

Figure 18:
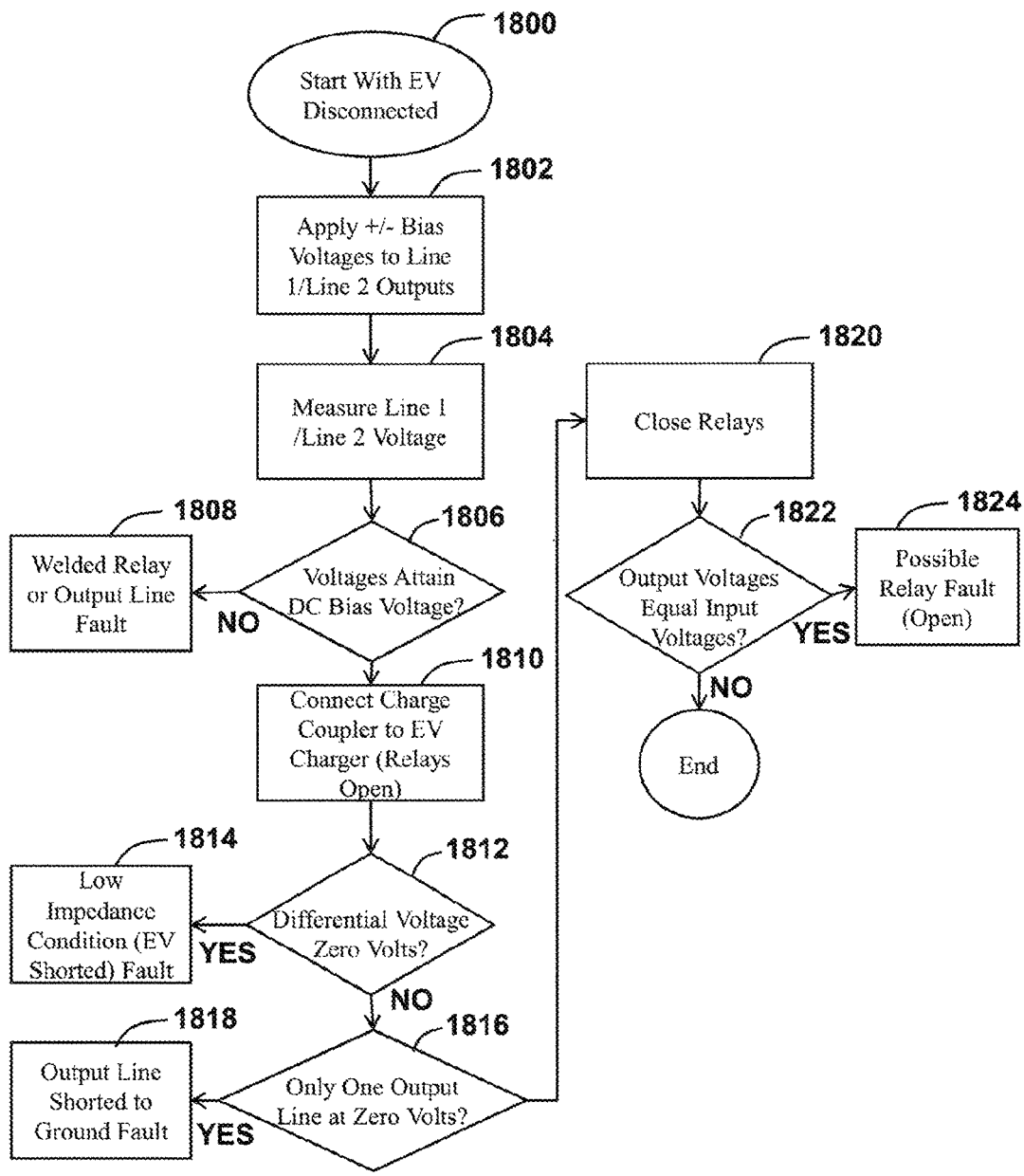
FIG. 18 is a flow diagram illustrating one embodiment of a method to use DC biasing to determine bipolar output impedance and welded contact faults for the EVSE system.

FIG. 18 illustrates one embodiment of a method to use DC biasing to determine the health and safety of the EVSE and EV for charging. Referring to FIGS. 12 and 18, the output voltage of the EVSE system 1200 results from closure of relays 1204. In rare occasions, the contact may become stuck or "welded" due to output impedances that are near zero ohms and which may create huge currents at relay 1204 closure. The normal load impedance of an EV charger is primarily capacitive when the charger is inactive, such as when power is first applied. If the EVSE were to close into an effectively DC "shorted" load, then a "weld" effect may be the result. For example, if a test shows that the impedance across the EV is significantly low, as would be the case for a near-shorted condition, then the controller 1208 may decide to not close into the suspicious load. With application of a DC bias through bias resisters $R_X$ 1230 and $R_Y$ 1232, pre-closure readings of the resistive and capacitive load impedance may be made so that the decision to close relays 1204 may be stopped before a faulty load is applied. The presence of the DC bias also allows determination of a "welded" contact in order to signal to the user that the contact is closed and output power is present when not expected.

More particularly, the charge coupler 1218 may be disconnected from an EV (block 1800) and a differential DC bias, preferably +/−15 V, applied through bias resisters $R_X$ and $R_Y$, respectively (block 1802). The voltage of Lines 1 and 2 may be measured (block 1804) to look for fault indications. If the Line 1 and Line 2 voltages do not appear to reach the DC bias voltage (test 1806), a welded relay or output line fault is indicated (block 1808) and the controller 1208 may indicate a fault through the user interface 1224. If, however, Line 1 and Line 2 voltages appear to attain DC bias voltages (test 1806), then the user may connect the charger coupler to the EV charger and the controller 1208 while the switch the relays 1204 remain open (block 1810). Voltages on Lines 1 and 2 are again measured and, if the differential voltage between Lines 1 and 2 is 0 V (test 1812), a low impedance condition fault condition is registered, such as may be the case if the EV is shorted (block 1814), and the controller 1208 may indicate a fault through the user interface 1224 or by other means such as an audible warning. If the differential voltage is not 0 V (test 1812), but either of the two lines (Line 1 and Line 2) indicates 0 V (test 1816), then an output line is shorted to ground indicating a fault (block 1818), and the controller 1208 may indicate a fault through the user interface 1224. Otherwise, the controller 1208 may close the relays 1204 using the relay control driver 1206 (block 1820). If the output voltages equal the input voltages (test 1822), then a possible relay open fault is indicated (block 1824) and the user may be notified through the user interface 1224.

Figure 19:
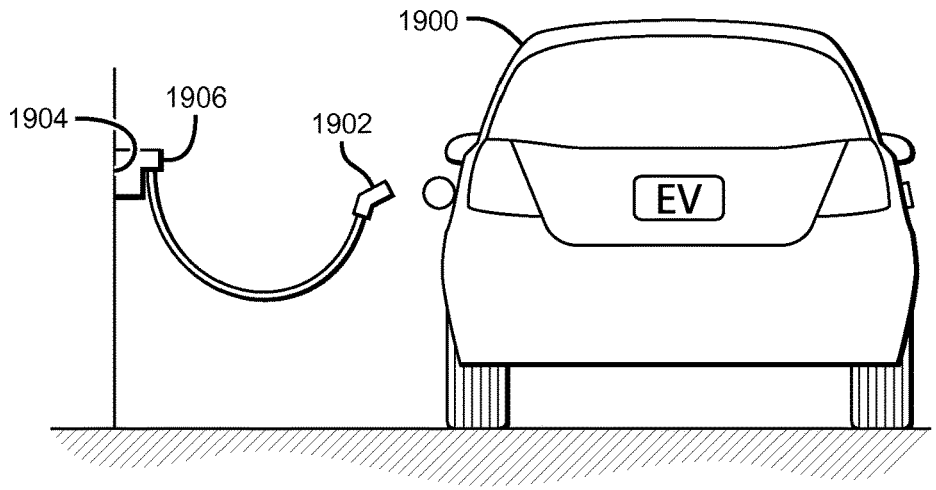
FIG. 19 is a system diagram illustrating one embodiment of an EVSE plugged into an AC utility circuit to charge an EV.

FIG. 19 is a system diagram illustrating one embodiment of an EVSE plugged into an AC utility circuit to charge an EV. An EV 1900 is coupled to a SAE-J1772-compliant connector 1902 to receive current provided by an AC power outlet 1904 through an EVSE 1906.

Figure 21A:
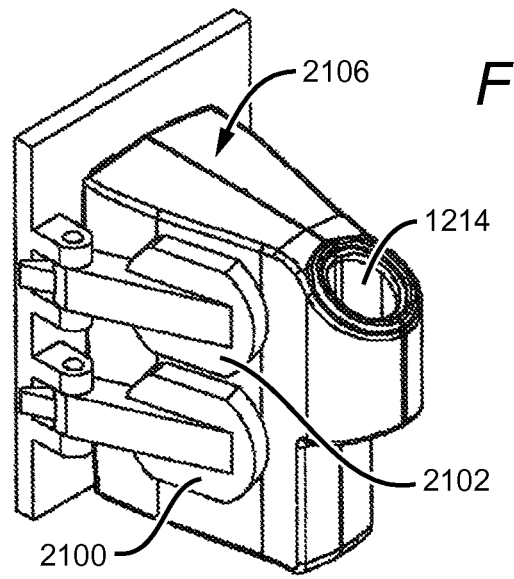
FIGS. 21A and 21B are perspective and top views of an EVSE plugged into a power outlet that has protective enclosures for respective receptacles, the protective enclosures each operable to open to a maximum angle (Anglex) of less than or equal to approximately 72 degrees with the front receptacle face.
Figure 21B:
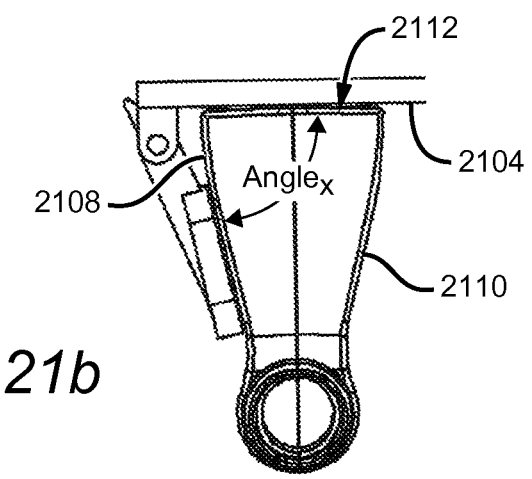

FIGS. 21A and 21B illustrate an EVSE plugged into a power outlet that has protective enclosures for respective receptacles. The protective enclosures (2100, 2102) are each operable to open to a maximum angle (Anglex) of less than or equal to approximately 72 degrees with a front receptacle face 2104 to receive an EVSE 2106 may have a case that has left and right gripping sides (2108, 2110) that also are at an angle (Anglex) of less than or equal to 72 degrees with the front receptacle face 2104. The front receptacle face 2104 is disposed parallel to a front plug face 2112 of the EVSE 2106 and so the front plug face 2112 may also be at an angle (Anglex) of less than or equal to 72 degrees with the left and right gripping sides (2108, 2110). A user interface in the form of an LED light 1214 may be presented to an exterior of the EVSE case 100. The LED light may be provided at an angle from the front plug face 2112 so that I user may see the LED light from either a top or front perspective position.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated. It is contemplated that various combinations and/or sub-combinations of the specific features, systems, methods, and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

We claim:

1. An electric vehicle service equipment (EVSE) system configured to be disposed within an outdoor plug enclosure, comprising:
   an EVSE case;
   a power cord attached to an EVSE case;
   a relay positioned within the EVSE case; and
   a controller positioned within the EVSE case and in communication with the relay, the controller responsive to a pilot duty signal, when a pilot duty signal is present;
   wherein the EVSE case includes a front plug face, a rear face, and left and right gripping sides that collectively define a trapezoidal prism cross section, the left and right gripping sides having left and right convex gripping portions, respectively, and further tapered such that a portion of the power cord can be positioned adjacent to the EVSE case within an encompassing outdoor plug enclosure;
   wherein the encompassing outdoor plug enclosure includes an outdoor protective cover defining an expanding storage space between an interior of the outdoor protective cover and an exterior of the EVSE case, the expanding storage space providing space for a portion of said power cord to be positioned adjacent to the EVSE case, wherein the power cord is configured to extend out from said protective cover of the encompassing outdoor plug enclosure when the protective cover is closed.

2. The EVSE system of claim 1, wherein a portion of the rear face has a base cutout to form a conning tower.

3. The EVSE system of claim 2, further comprising a cable connected to the conning tower at an orientation that is perpendicular to the front plug face so that the cable extends initially parallel to the front plug face.

4. The EVSE system of claim 1, wherein the distance from the front plug face to the rear face is less than or equal to 3.1 inches.

5. The EVSE system of claim 1, further comprising:
power and neutral plug blades extending from the front plug face; and
a thermistor in thermal communication with the power and neutral plug blades.

6. The EVSE system of claim 1, further comprising:
a transformer.

7. The EVSE system of claim 6, wherein the transformer is a flyback-based transformer.

8. The EVSE system of claim 1, further comprising:
an outdoor plug enclosure encompassing the EVSE case.

9. The EVSE system of claim 1, wherein at least one of the left and right gripping sides are at an angle (Anglex) of less than or equal to 72 degrees with the front plug face.

10. An electric vehicle service equipment (EVSE) system configured to be disposed within an outdoor plug enclosure, comprising:
an EVSE case;
a power cord attached to an EVSE case;
a relay positioned within the EVSE case; and
a controller positioned within the EVSE case and in communication with the relay, the controller responsive to a pilot duty signal, when a pilot duty signal is present;
wherein an internal volume of the EVSE case includes a narrow region and a wider region which collectively form an interior tapered electronics volume that extends away from a front plug face and that contains various electrical components of the EVSE system, wherein the narrow region is sized to contain smaller components of the EVSE system, and wherein the wider region is sized to contain larger components of the EVSE system;
wherein the power cord is configured to extend out from a protective cover of an encompassing outdoor plug enclosure when the protective cover is closed.

11. The EVSE system of claim 10, wherein a portion of the rear face has a base cutout to form a conning tower.

12. The EVSE system of claim 11, further comprising a cable connected to the conning tower at an orientation that is perpendicular to the front plug face so that the cable extends initially parallel to the front plug face.

13. The EVSE system of claim 10, wherein the distance from the front plug face to the rear face is less than or equal to 3.1 inches.

14. The EVSE system of claim 10, further comprising:
power and neutral plug blades extending from the front plug face; and
a thermistor in thermal communication with the power and neutral plug blades.

15. The EVSE system of claim 10, further comprising:
a transformer.

16. The EVSE system of claim 15, wherein the transformer is a flyback-based transformer.

17. The EVSE system of claim 10, further comprising:
an outdoor plug enclosure encompassing the EVSE case.

18. The EVSE system of claim 10, wherein at least one of the left and right gripping sides are at an angle (Anglex) of less than or equal to 72 degrees with the front plug face.

19. An electric vehicle service equipment (EVSE) system configured to be disposed within an outdoor plug enclosure, comprising:
an EVSE case;
a power cord attached to an EVSE case;
a relay positioned within the EVSE case; and
a controller positioned within the EVSE case and in communication with the relay, the controller responsive to a pilot duty signal, when a pilot duty signal is present;
the EVSE case includes a front plug face, a rear face, and left and right gripping sides that collectively define a trapezoidal prism cross section, the left and right gripping sides further having left and right convex gripping portions, respectively and further tapered such that a portion of the power cord can be positioned adjacent to the EVSE case within an encompassing outdoor plug enclosure;
wherein the encompassing outdoor plug enclosure includes an outdoor protective cover defining an expanding storage space between an interior of the outdoor protective cover and an exterior of the EVSE case, the expanding storage space providing space for a portion of said power cord to be positioned adjacent to the EVSE case, wherein the power cord is configured to extend out from said protective cover of the encompassing outdoor plug enclosure when the protective cover is closed; and
wherein an internal volume of the EVSE case includes a narrow region and a wider region which collectively form an interior tapered electronics volume that extends away from the front plug face and that contains various electrical components of the EVSE system, wherein the narrow region is sized to contain smaller components of the EVSE system, and wherein the wider region is sized to contain larger components of the EVSE system.

20. The EVSE system of claim 19, further comprising:
a relay positioned within the EVSE case; and
a controller positioned within the EVSE case and in communication with the relay, the controller responsive to a pilot duty signal, when a pilot duty signal is present.

21. The EVSE system of claim 20, further comprising:
power and neutral plug blades extending from the front plug face; and
a thermistor in thermal communication with the power and neutral plug blades.

22. The EVSE system of claim 20, further comprising:
a transformer.

23. The EVSE system of claim 22, wherein the transformer is a flyback-based transformer.

24. The EVSE system of claim 19, wherein a portion of the rear face has a base cutout to form a conning tower.

25. The EVSE system of claim 24, further comprising a cable connected to the conning tower at an orientation that is perpendicular to the front plug face so that the cable extends initially parallel to the front plug face.

26. The EVSE system of claim 19, wherein the distance from the front plug face to the rear face is less than or equal to 3.1 inches.

27. The EVSE system of claim 19, further comprising:
a connector for connecting to an electric vehicle (EV); and
a cord, wherein the cord transmits data and power between the connector and the EVSE case.

28. The EVSE system of claim 19, wherein at least one of the left and right gripping sides are at an angle (Anglex) of less than or equal to 72 degrees with the front plug face.

* * * * *